US012563781B2

(12) United States Patent
Van Dal et al.

(10) Patent No.: US 12,563,781 B2
(45) Date of Patent: Feb. 24, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Marcus Johannes Henricus Van Dal, Linden (BE); Gerben Doornbos, Kessel-Lo (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1 day.

(21) Appl. No.: 17/682,087

(22) Filed: Feb. 28, 2022

(65) Prior Publication Data

US 2022/0181491 A1     Jun. 9, 2022

Related U.S. Application Data

(62) Division of application No. 16/658,768, filed on Oct. 21, 2019, now Pat. No. 11,264,506.

(Continued)

(51) Int. Cl.
   *H10D 30/67*      (2025.01)
   *H10D 62/10*      (2025.01)

(52) U.S. Cl.
   CPC ..... *H10D 30/6735* (2025.01); *H10D 30/6755* (2025.01); *H10D 30/6756* (2025.01); *H10D 62/121* (2025.01)

(58) Field of Classification Search
   CPC ........... H01L 29/7869; H01L 29/78693; H01L 29/78696; H01L 29/42392; H01L 29/24;
   (Continued)

(56) References Cited

U.S. PATENT DOCUMENTS

2005/0272231 A1   12/2005   Yun et al.
2007/0158679 A1   7/2007   Li et al.
   (Continued)

FOREIGN PATENT DOCUMENTS

CN   103238208 A   8/2013
CN   108369948 A   8/2018
   (Continued)

OTHER PUBLICATIONS

Shao Hui Wu, "Performance Boost of Crystalline In—Ga—Zn—O Material and Transistor with Extremely Low Leakage for IoT Normally-Off CPU Application", 2017 Symposium on VLSI Technology Digest of Technical Papers. T166-T167.
   (Continued)

*Primary Examiner* — Peter M Albrecht
(74) *Attorney, Agent, or Firm* — STUDEBAKER BRACKETT PLLC

(57)                    ABSTRACT
A semiconductor device includes a power switch circuit and a logic circuit. The semiconductor device includes a first dielectric layer and a thin film transistor (TFT) formed on the first dielectric layer. The TFT includes a semiconductor nano-sheet, a gate dielectric layer wrapping around a channel region of the semiconductor nano-sheet, and a gate electrode layer formed on the gate dielectric layer. The semiconductor nano-sheet is made of an oxide semiconductor material.

20 Claims, 23 Drawing Sheets

Related U.S. Application Data

(60) Provisional application No. 62/753,890, filed on Oct. 31, 2018.

(58) Field of Classification Search
CPC .............. H01L 29/247; H01L 29/0673; H10D 30/6735; H10D 30/6755; H10D 30/6756; H10D 62/121
See application file for complete search history.

(56) References Cited

U.S. PATENT DOCUMENTS

| | | | |
|---|---|---|---|
| 2008/0230853 A1* | 9/2008 | Jang | H01L 29/0673 257/401 |
| 2011/0175646 A1 | 7/2011 | Takemura et al. | |
| 2012/0138886 A1 | 6/2012 | Kuhn et al. | |
| 2012/0313153 A1* | 12/2012 | Zhang | H01L 21/823871 257/288 |
| 2014/0001441 A1 | 1/2014 | Kim et al. | |
| 2014/0017890 A1 | 1/2014 | Cohen et al. | |
| 2014/0339546 A1* | 11/2014 | Yamazaki | H01L 29/7869 257/43 |
| 2015/0162448 A1* | 6/2015 | Raghavan | H01L 29/7869 257/43 |
| 2015/0179798 A1* | 6/2015 | Clendenning | H01L 29/0676 438/283 |
| 2015/0280703 A1* | 10/2015 | Jeon | H03K 17/165 327/382 |
| 2017/0140996 A1 | 5/2017 | Lin et al. | |
| 2017/0154958 A1 | 6/2017 | Fung et al. | |
| 2018/0024618 A1* | 1/2018 | Steudel | G06F 1/3287 713/323 |
| 2018/0323264 A1* | 11/2018 | Le | H10D 62/121 |
| 2018/0366587 A1 | 12/2018 | Le et al. | |
| 2019/0131437 A1 | 5/2019 | Le et al. | |
| 2019/0153595 A1* | 5/2019 | Wang | H01L 29/7869 |
| 2019/0333990 A1 | 10/2019 | Lilak et al. | |
| 2020/0006388 A1 | 1/2020 | Dewey et al. | |
| 2020/0091288 A1 | 3/2020 | Lee et al. | |
| 2020/0105751 A1* | 4/2020 | Dewey | H01L 29/78696 |
| 2020/0152635 A1* | 5/2020 | Sharma | H01L 29/7869 |
| 2020/0227535 A1* | 7/2020 | Sung | H01L 29/7869 |

FOREIGN PATENT DOCUMENTS

| | | |
|---|---|---|
| JP | 2018-164085 A | 10/2018 |
| KR | 10-2016-0061876 A | 6/2016 |
| WO | 2017/111797 A1 | 6/2017 |

OTHER PUBLICATIONS

Shunpei Yamazaki, "Unique Technology from Japan to the World—Super Low Power LSI using CAAC-OS-" Semiconductor Energy Laboratory presentation (May 27, 2015).

* cited by examiner

SEMICONDUCTOR DEVICE AND MANUFACTURING METHOD THEREOF

RELATED APPLICATION

This application is divisional of U.S. patent application Ser. No. 16/658,768 filed Oct. 21, 2019, now U.S. Pat. No. 11,264,506, which claims priority to U.S. Provisional Patent Application No. 62/753,890 filed Oct. 31, 2018, the entire content of each of which is incorporated herein by reference.

BACKGROUND

As the size of semiconductor devices becomes smaller, a cell height of standard cells also becomes smaller. The cell height is generally defined as a periodic distance (pitch) between two power supply lines, VDD and VSS, and is generally determined by the number and a pitch of fin structures and/or metal lines. The cell height is also called a track height. Typical track heights are 7.5 T, 6.5 T or 5.5 T, where T is a smallest pitch of metal lines running over the standard cell. Scaling down to 4.5 T or 4 T is currently required to further minimize the size of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is an isometric view and FIG. 6B is a plan view.

FIG. 7A is an isometric view and FIG. 7B is a plan view.

FIG. 8A is an isometric view and FIG. 8B is a plan view.

FIG. 9A is an isometric view and FIG. 9B is a plan view.

FIG. 10A is an isometric view and FIG. 10B is a plan view.

FIG. 11A is an isometric view and FIG. 11B is a plan view.

FIG. 12A is an isometric view and FIG. 12B is a plan view.

FIG. 13A is an isometric view and FIG. 13B is a plan view.

FIG. 14A is an isometric view and FIG. 14B is a plan view.

FIG. 15A is an isometric view and FIG. 15B is a plan view.

FIG. 16A is an isometric view and FIG. 16B is a plan view.

FIG. 17A is an isometric view and FIG. 17B is a plan view.

FIG. 18A is an isometric view and FIG. 18B is a plan view.

FIG. 19A is an isometric view and FIG. 19B is a plan view.

FIG. 20A is an isometric view and FIG. 20B is a plan view FIG. 21A is an isometric view and FIG. 21B is a plan view FIG. 22A is an isometric view and FIG. 22B is a plan view.

DETAILED DESCRIPTION

Figure 1:
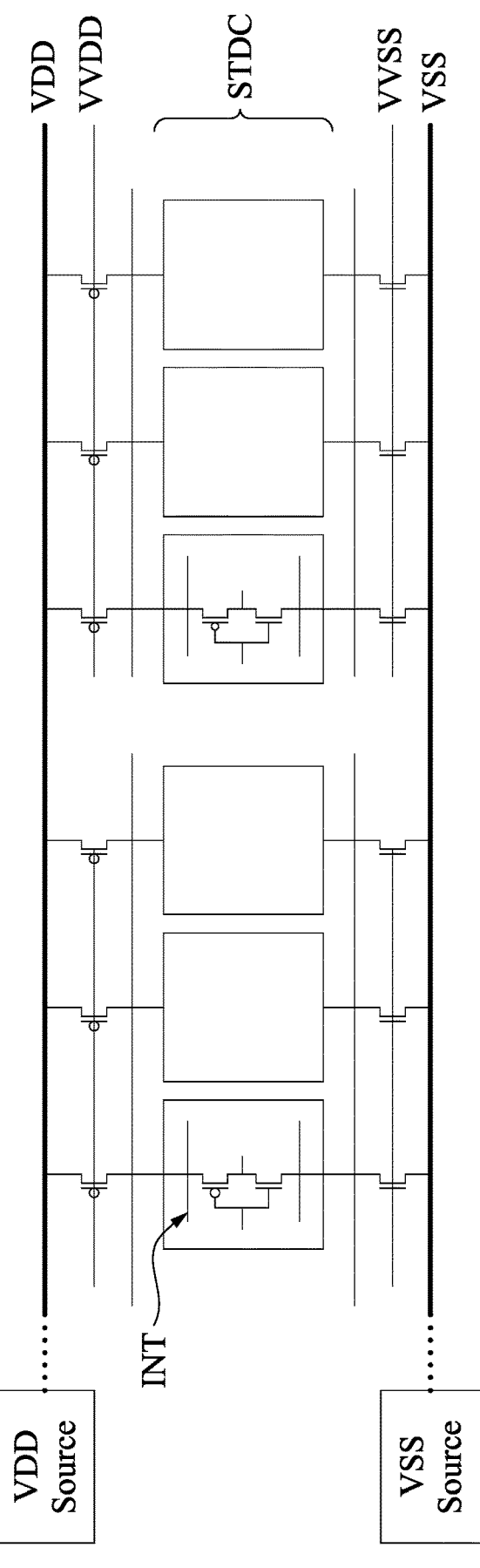
FIG. 1 shows a circuit diagram of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

Minimization of power consumption in a semiconductor device, such as an integrated circuit (IC), is a critical issue for semiconductor devices for high speed operations and/or semiconductor devices for mobile terminals. Various technologies to reduce the power consumption have been proposed, but many of them require a larger chip area due to additional circuitry for controlling power. One such technology includes providing a virtual power supply line (VVDD and/or VVSS) together with a header switch and/or a footer switch between a main power supply line (VDD and/or VSS) and the virtual power supply line. The virtual power supply line may be called a local power supply line, while the main power supply line may be called a global power supply line. It is noted that VDD is generally at a higher potential (voltage) than VSS, and in some embodiments, VSS is coupled to the ground (0 V). The power consumption is reduced by turning-off (opening) the header/footer switch coupled to a non-active functional circuit in the semiconductor device.

FIG. 1 shows a circuit diagram of a semiconductor device according to an embodiment of the present disclosure. As shown in FIG. 1, a p-type MOS FET is used as a header switch and an n-type MOS FET is used as a footer switch to shut off the power supply to the local VVDD which further supplies power to blocks comprising one or more standard cells STDC, each including a functional circuit (e.g., a CMOS inverter). In some embodiments, no footer switch is used and the standard cells are directly coupled to the VSS. In some embodiments, as shown in FIG. 1, a first main power supply line VDD is coupled to a VDD generation circuit (Vdd Source) which generates a voltage, such as 0.5 V, 0.8 V, 1.0 V, 1.2 V, 1.8 V, 2.4 V, 3.3 V or 5.0 V. A second main power supply line VSS is coupled to a VSS generation circuit (Vss Source) which generates a voltage lower than VDD, or the ground, in some embodiments. As shown in FIG. 1, the local power supply lines VVDD is divided into a plurality of local power supply lines, to each of which one or more standard cells STDC are connected, as a cell block. Accordingly, power supply to the standard cells can be controlled on a block-by-block basis. Further, in some embodiments, the standard cells STDC includes an internal power supply line (bus line) INT, and the local power supply line VVDD is coupled to the internal power supply line with or without a switch.

Figure 2:
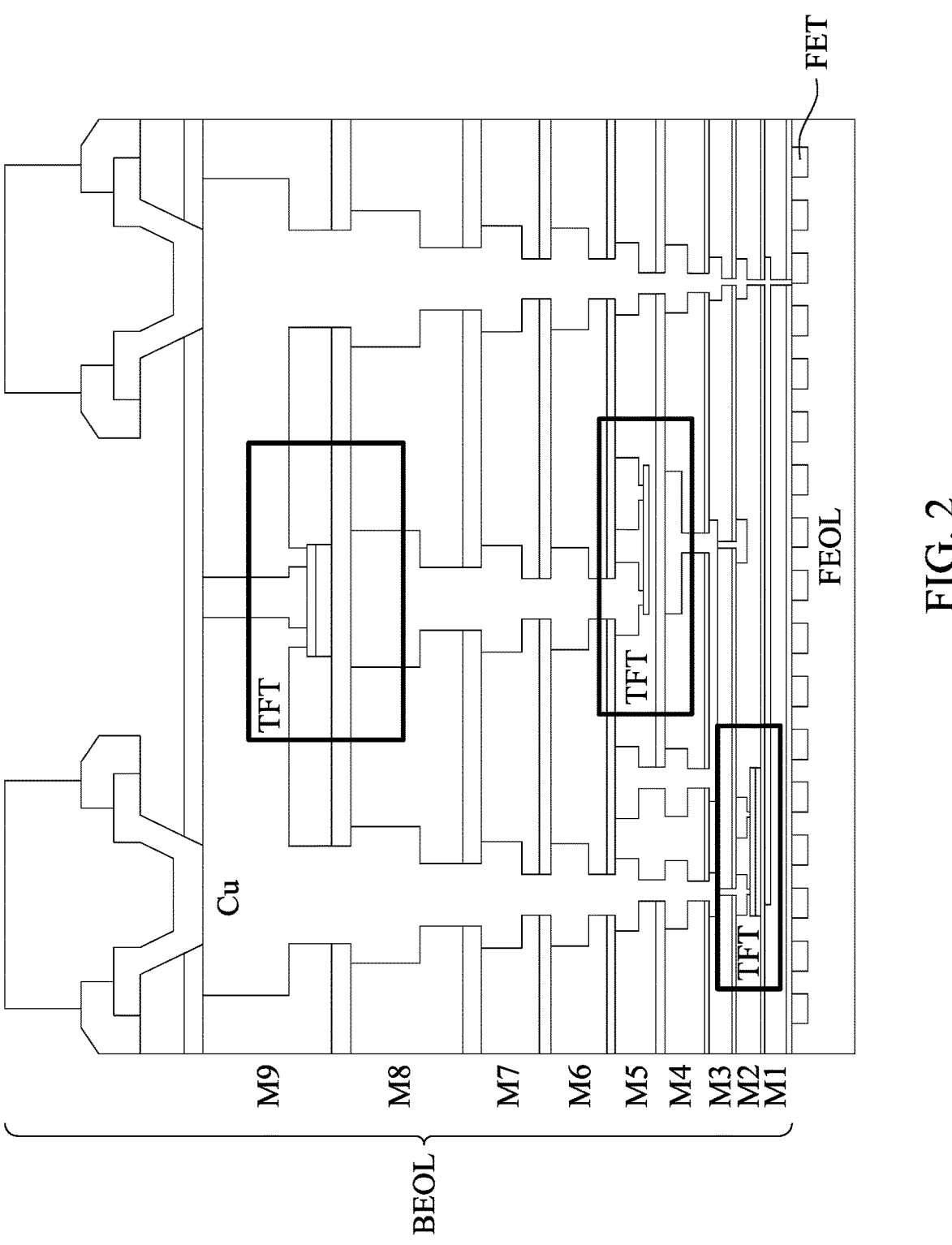
FIG. 2 shows a cross sectional view of a semiconductor device according to an embodiment of the present disclosure.

In embodiments of the present disclosure, a power switch circuit (header and/or footer switch) is moved from the front end of the line (FEOL) circuit level to the back end of the line (BEOL) circuit level in a semiconductor device to allow for reduced size devices, as shown in FIG. 2. The FEOL circuit level includes MOS transistors formed on a semiconductor substrate. The MOS transistors incudes planar field effect transistors (FETs), fin FETs, and/or gate-all-around (GAA) FETs. The FEOL circuit level further includes local interconnects in some embodiments. The BEOL circuit level includes metal wiring structures, which include one or more dielectric layers, metal wirings and vias embedded in the dielectric layer. Moving the power switch circuit from the FEOL circuit level to the wiring layers in the BEOL circuit level allows the device area to be reduced by about 10%. Placing the power switch circuit in the BEOL circuit level requires fewer vias to be used, thus freeing up space for more wire routing to the logic block, and thereby increasing the device density in the logic block. TFTs using non-crystalline semiconductor are suitable for a back-end-of-line process because non-crystalline semiconductor can generally be formed at a low temperature, for example, less than 450° C.

In some embodiments, the power switch circuit incudes thin-film transistors (TFTs) as shown in FIG. 2, because manufacturing operations of TFTs do not generally require a high temperature to form, for example, an epitaxial semiconductor channel, and are suitable for the BEOL circuit level. The power switch circuit is placed in, for example, M1-M2 level, M4-M5 level or M8-M9 level as shown in FIG. 2.

In some embodiments of the present disclosure, the channel region of the TFTs includes oxide semiconductors, such as amorphous indium gallium zinc oxide (IGZO), c-axis aligned crystal (CAAC)-IGZO, ZnO, $In_2O_3$, $Ga_2O_3$, and ZnON.

Transistors of the power switch circuit generally require a low on-resistance $R_{on}=V_{ds}/I_d$. IGZO, for example, offers extremely low off-current $I_{off}$ (low leakage current), and IGZO TFTs have a large $I_{on}/I_{off}$ ratio. However, since amorphous-IGZO (a-IGZO) has a low electron mobility (~15 $cm^2Vs$), a single-layer, planar TFT made of a-IGZO would not be sufficient for the necessary $R_{on}$ value for a power switch circuit.

To compensate for this property, the channel width War is increased in some embodiments to provide a low $R_{on}>R_{eh}=L_g/(W_{eff}$ mobility $C_{ox}$ $(V_g-V_t))$, because $C_{ox}$ is usually not able to be increased due to gate current constraints and $V_g-V_t$ is set by the supply voltage. In embodiments of this disclosure, a multiple stacked nano-sheet gate-all-around oxide semiconductor device structure and corresponding process flow are provided to increase the effective width per footprint to reduce $R_{on}$ without compromising the $I_{on}/I_{off}$ ratio. The benefits of using an oxide semiconductor, like IGZO, includes low leakage current, reasonable electron mobility, and high reliability.

Figure 3:
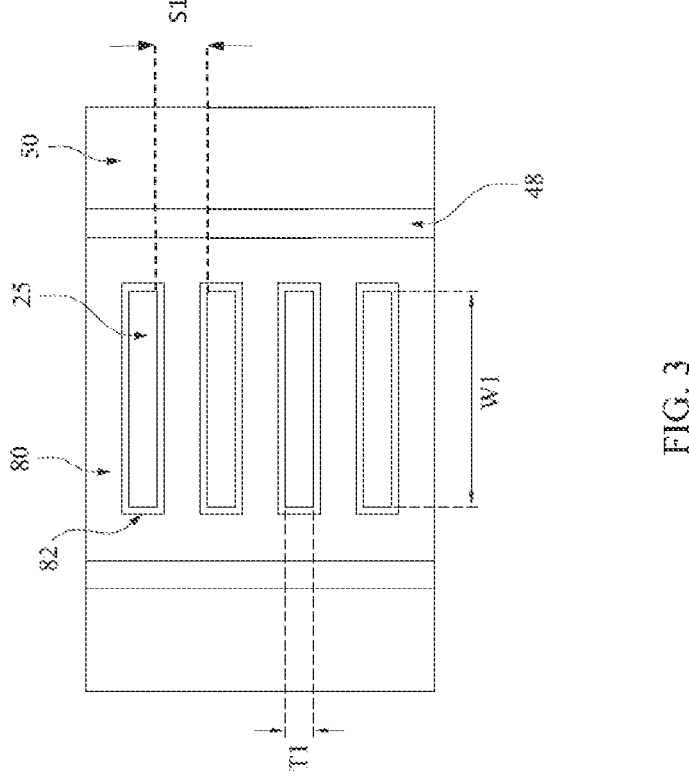
FIG. 3 shows a cross sectional view of a semiconductor device according to an embodiment of the present disclosure.
Figure 4:
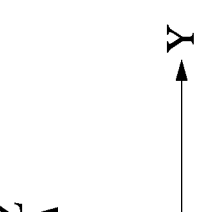
FIG. 4 shows a cross sectional view of a semiconductor device according to an embodiment of the present disclosure.

FIG. 3 is a schematic cross-sectional illustration cut (X-Z plane) across the oxide semiconductor nano-sheet of a semiconductor device and FIG. 4 is a schematic cross-sectional illustration cut (Y-Z plane) across the gate electrode of the semiconductor device according to an embodiment of the disclosure.

In some embodiments, the semiconductor device is a gate all around (GAA) FET as shown in FIGS. 3 and 4. In some embodiments, the oxide semiconductor nano-sheets 25 extend in the Y direction (source-to-drain direction) and are stacked along the Z direction (vertical direction). Although four oxide semiconductor nano-sheets 25 are illustrated in FIGS. 3 and 4, the number of the oxide semiconductor nano-sheets 25 can be as few as 2 and as many as 20 depending on a required current. In some embodiments, the number of the oxide semiconductor nano-sheets ranges from 4 to 10. A width W1 of the oxide semiconductor nano-sheets 25 is in a range from about 10 nm to about 50 nm in some embodiments, and is in a range from about 15 nm to about 30 nm in other embodiments, depending on the required current and/or manufacturing process conditions. A thickness T1 of the oxide semiconductor nano-sheets 25 is in a range from about 5 nm to about 30 nm in some embodiments, and is in a range from about 10 nm to about 20 nm in other embodiments, depending on the required current and/or manufacturing process conditions. In some embodiments, W1>T1. In some embodiments, an aspect ratio W1/T1 is in a range from about 1.2 to about 10 and is in a range from about 2 to about 5 in other embodiments. A space S1 between adjacent oxide semiconductor nano-sheets 25 is in a range from about 5 nm to about 30 nm in some embodiments, and is in a range from about 10 nm to about 20 nm in other embodiments, depending on the required current and/or manufacturing process conditions. In some embodiments, S1≥T1 and in other embodiments, S1<T1. If the space Si is too narrow, it would be difficult to uniformly form layers (e.g., gate dielectric layer and a gate electrode layer) to wrap around the oxide semiconductor nano-sheet 25.

A gate dielectric layer 82 wraps around each of the oxide semiconductor nano-sheet 25. In some embodiments, the gate dielectric layer is a high-k dielectric material, such as, silicon nitride, $HfO_2$, $La_2O_3$, $ZrO_2$, BaO, $TiO_2$, $Ta_2O_5$, SrO, $Y_2O_3$, $HfSiO_4$, $ZrSiO_4$, $Al_2O_3$, MgO, CaO, other suitable high-k dielectric materials, and/or combinations thereof. A thickness of the gate dielectric layer 82 is in a range from about 2 nm to about 20 nm in some embodiments. The gate dielectric layer 82 may be formed from CVD, ALD or any suitable method. In one embodiment, the gate dielectric layer is formed using a highly conformal deposition process such as ALD in order to ensure the formation of a gate dielectric layer having a uniform thickness around each oxide semiconductor nano-sheet.

A metal gate electrode 80 is formed on the gate dielectric layer 82 so as to wrap around each of the oxide semiconductor nano-sheets 25. The metal gate electrode 80 includes multiple conductive layers in some embodiments. In some embodiments, the metal gate electrode 80 includes one or more work function adjustment layers 84 and a body metal gate electrode layer 86. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. The work function adjustment layer may be formed by ALD, PVD, CVD, e-beam evaporation, or other suitable process. Further, the work function adjustment layer 84 may be formed separately for the nFET and the pFET which may use different metal layers. The body gate electrode layer is formed to surround each oxide semiconductor nano-sheet (channel region). The body gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The body gate electrode layer may be formed from CVD, ALD, electro-plating, or other suitable method.

The gate structure including the gate dielectric layer 82 and the metal gate electrode 80 are disposed between gate sidewall spacers 48 as shown in FIG. 3, and an interlayer dielectric (ILD) layer 50 is further disposed as shown in FIG. 3.

In some embodiments, inner spacers 21 are disposed between the gate electrode layer 84 and the source/drain contact 70 as shown in FIG. 4. The inner spacers 21 are remaining portions of a sacrificial layer 20 as explained below.

The oxide semiconductor nano-sheet 25 also has a source/drain region as shown in FIG. 4. A source/drain contact 70 is formed in contact with and wraps around the source/drain region of each of the oxide semiconductor nano-sheets 25. In some embodiments, the source/drain contact 70 has a multilayer structure. The source/drain contact 70 includes a liner or a barrier layer 72 and a body contact layer 74 in some embodiments as shown in FIG. 4. In some embodiments, the liner layer 72 is made of one or more of Ti, TiN, Ta, and TaN, and the body contact layer 74 is made of one or more of W, Cu, Ti, Ag, Al, Mn, Co, Pd, Ni, Re, Ir, Ru, Pt, and Zr.

In some embodiments, the oxide semiconductor nano-sheets 25 pass through the source/drain contact 70 and reaches the ILD layer 50 as shown in FIG. 4. In other embodiments, the ends of the oxide semiconductor nano-sheets 25 are located in the source/drain contact 70.

Figure 5:
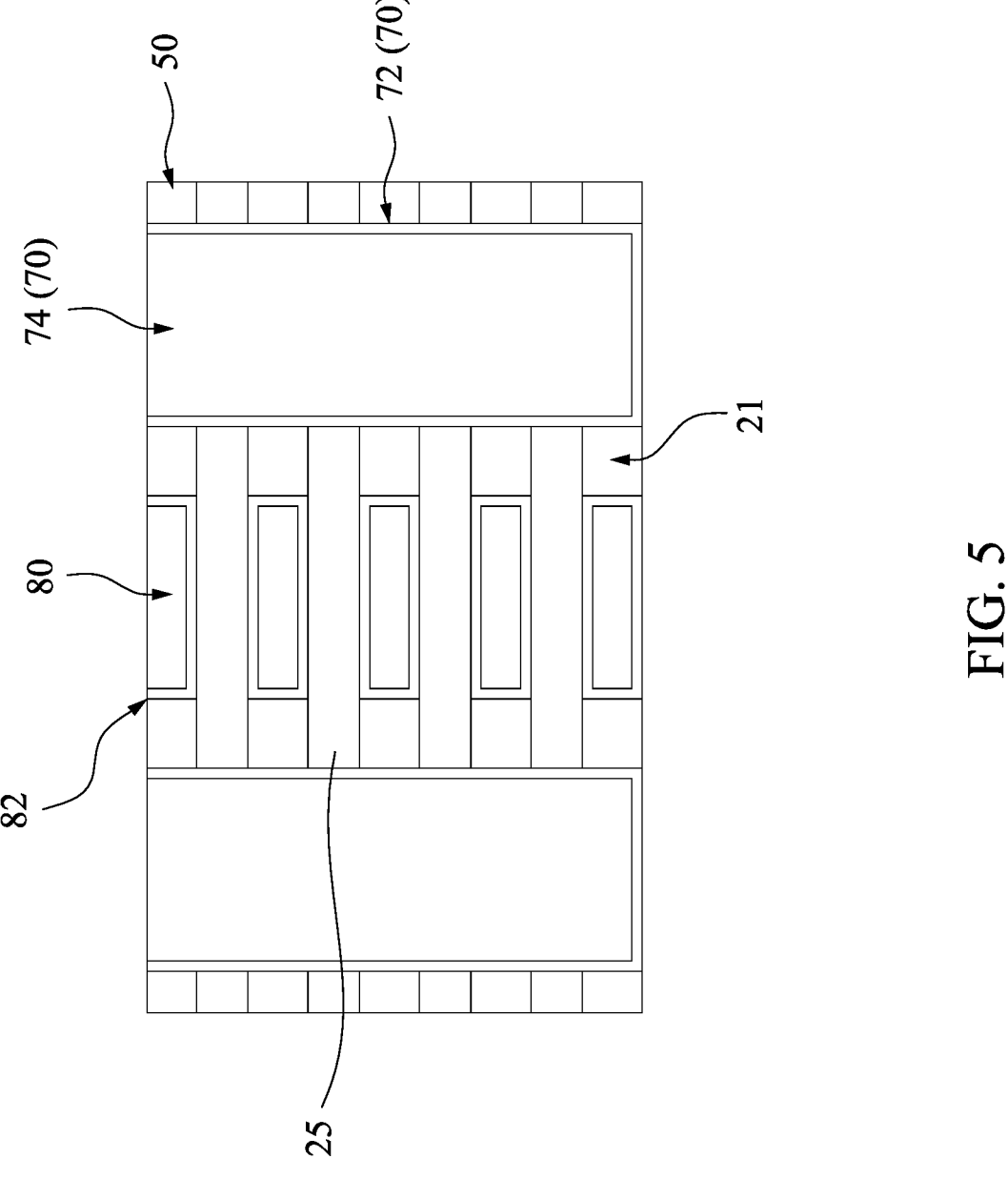
FIG. 5 shows a cross sectional view of a semiconductor device according to an embodiment of the present disclosure.

FIG. 5 is a schematic cross-sectional illustration cut (Y-Z plane) across the gate electrode of the semiconductor device according to another embodiment of the disclosure.

In this embodiment, the oxide semiconductor nano-sheets 25 do not penetrate into or pass through the source/drain contact 70. The source/drain contact 70 covers end faces of the oxide semiconductor non-sheets 25, as shown in FIG. 5.

FIGS. 6A-20B show sequential operations for manufacturing a semiconductor device according to an embodiment of the present disclosure. It is understood that additional operations can be provided before, during, and after the processes shown by FIGS. 6A-20B, and some of the operations described below can be replaced or eliminated, for additional embodiments of the method. The order of the operations/processes may be interchangeable. The "A" figures show isometric views and the "B" figures show plan (top) views.

Figure 6B:
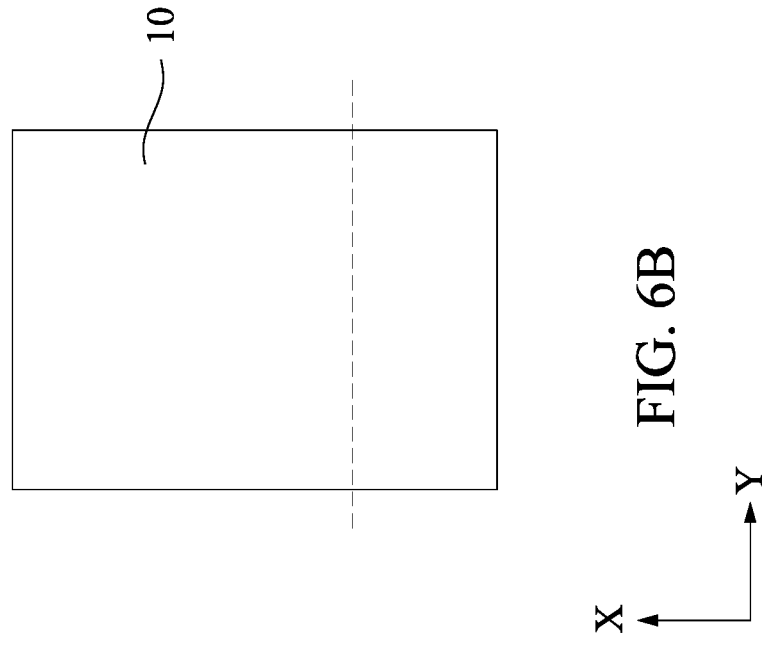
FIGS. 6A and 6B are schematic illustrations of a sequential process of manufacturing a semiconductor device according to an embodiment of the present disclosure.
Figure 6A:
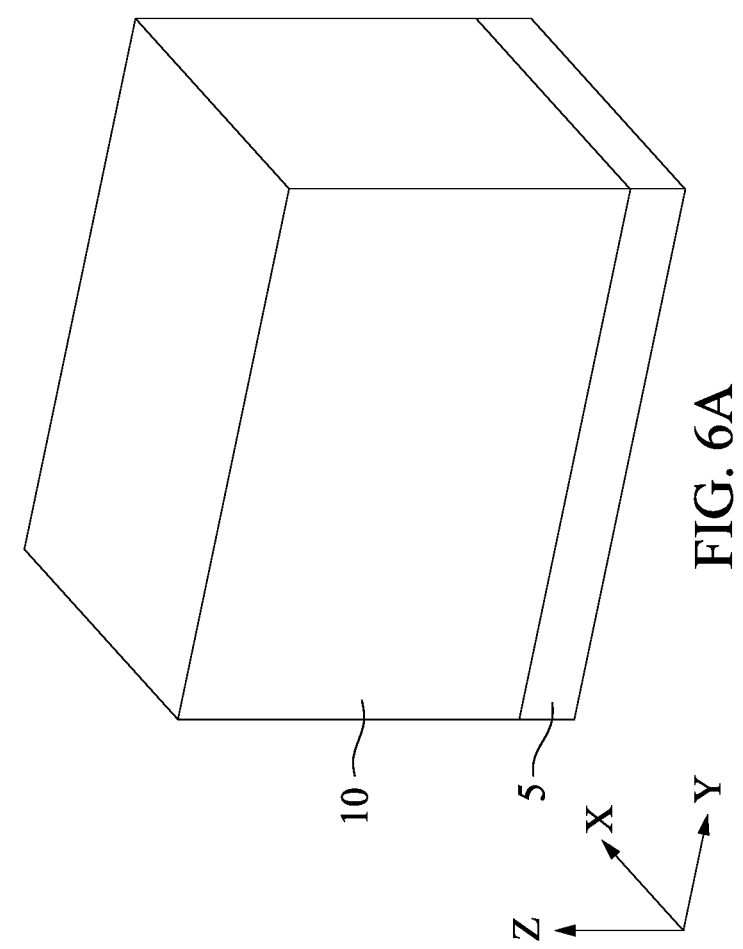

FIGS. 6A and 6B are schematic illustrations of one of the stages of a sequential manufacturing operation of a semiconductor device according to an embodiment of the present disclosure. As shown in FIG. 6A, a substrate 5 is provide. In some embodiments, the substrate 5 includes a single crystal semiconductor layer on at least its surface portion. The substrate 5 may comprise a single crystal semiconductor material such as, but not limited to Si, Ge, SiGe, GaAs, InSb, GaP, GaSb, InAlAs, InGaAs, GaSbP, GaAsSb and InP. In certain embodiments, the substrate 5 is made of crystalline Si, SiGe or Ge. The substrate 5 may include in its surface region, one or more buffer layers (not shown) in some embodiments. The buffer layers can serve to gradually change the lattice constant from that of the substrate to that of the source/drain regions. The buffer layers may be formed from epitaxially grown single crystal semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 5 comprises silicon germanium (SiGe) buffer layers epitaxially grown on the silicon substrate 5. The germanium concentration of the SiGe buffer layers may increase from 30 atomic % germanium for the bottom-most buffer layer to 70 atomic % germanium for the top-most buffer layer.

Further, as shown in FIG. 6A, one or more first interlayer dielectric (ILD) layers 10 are formed over the substrate 5. In some embodiments, one or more electronic devices, such as transistors (e.g., FETs), memories (e.g., dynamic random access memory (DRAM), static RAM, magnetic MRAM, and/or phase change RAM), are formed on the substrate 5 and the one or more first interlayer dielectric layers 10 cover the electronic devices.

In some embodiments, one or more metal wiring structures are embedded in the ILD layers 10. The dielectric material for the first ILD layers 10 includes silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation method. An annealing operation may be performed after the formation of the first ILD layer 10. In some embodiments, a planarization operation, such as a chemical mechanical polishing (CMP) method and/or an etch-back method, is performed to flatten the surface of the first ILD layer 10.

Figure 7B:
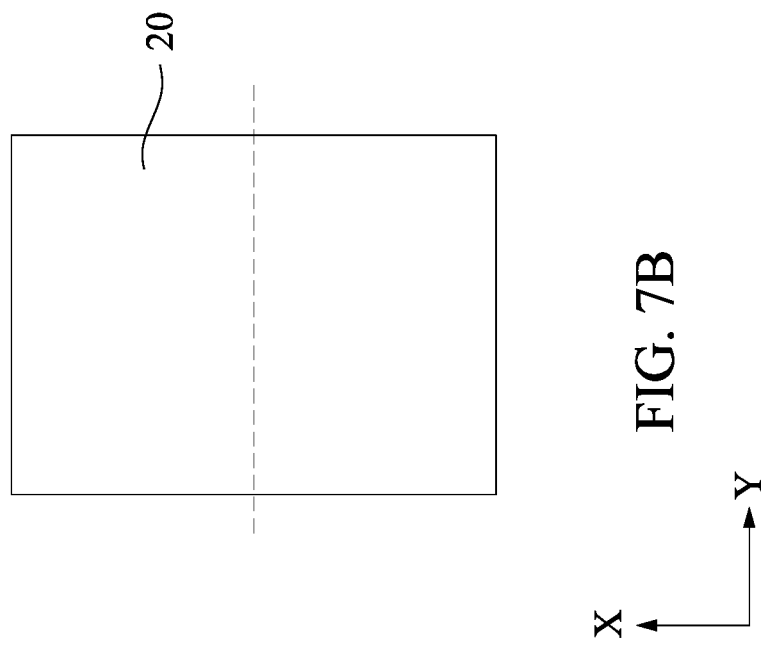
FIGS. 7A and 7B are schematic illustrations of a sequential process of manufacturing a semiconductor device according to an embodiment of the present disclosure.
Figure 7A:
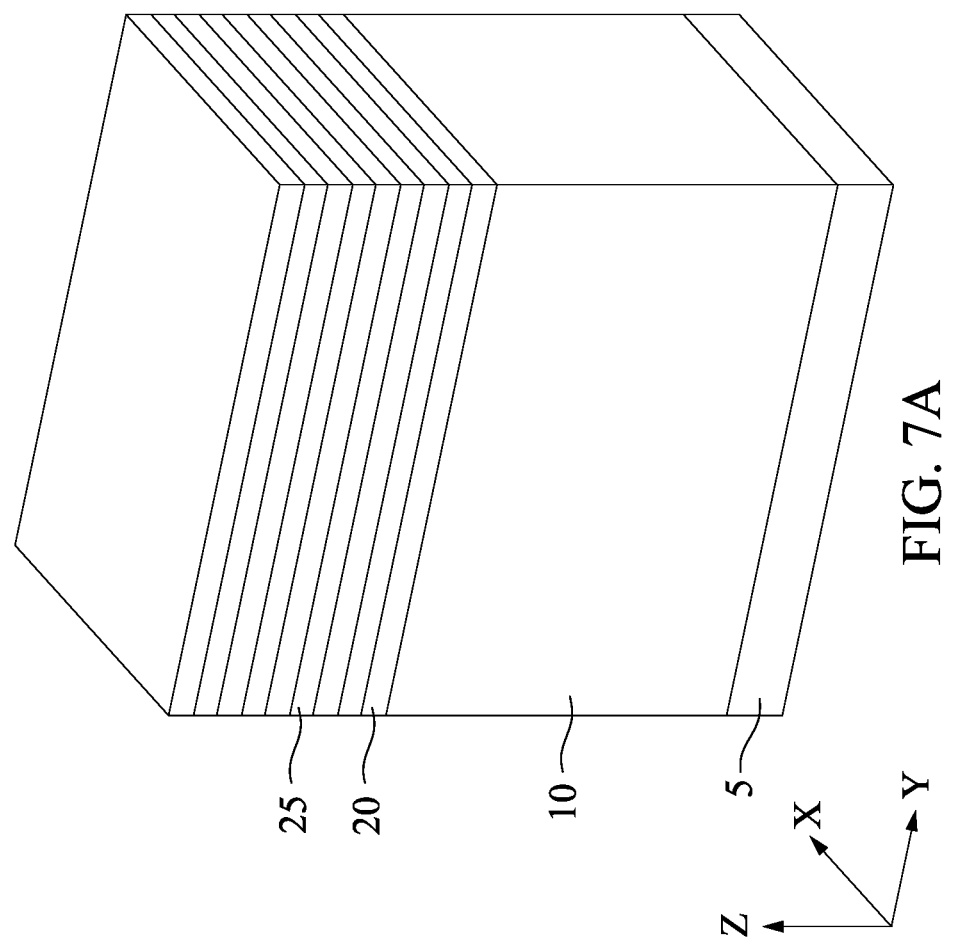

FIGS. 7A and 7B are schematic illustrations of a sequential step of manufacturing a semiconductor device according to an embodiment of the present disclosure. In some embodiments, semiconductor layers 25 and sacrificial layers 20 are alternately formed over the ILD layer 10.

In some embodiments, the semiconductor layers 25 are made of oxide semiconductor materials, such as such as amorphous indium gallium zinc oxide (IGZO), c-axis aligned crystal (CAAC)-IGZO, ZnO, $In_2O_3$, $Ga_2O_3$, and ZnON. In some embodiments, amorphous IGZO is used. The semiconductor layers 25 are formed by CVD, atomic layer deposition (ALD), physical vapor deposition including sputtering, or any other suitable film formation method. In some embodiments, the semiconductor layers 25 are formed by CVD at a temperature in a range from about 50° C. to 600° C. In other embodiments, the semiconductor layers 25 are formed by atomic layer deposition (ALD) at a temperature in a range from about 25° C. to 400° C. In some embodiments, the semiconductor layers 25 are formed by physical vapor deposition including sputtering at a temperature in a range from about 25° C. to 400° C.

In some embodiments, the sacrificial layers 20 are made of different material than the semiconductor layers 25 so that the sacrificial layers 20 are removed selective to the semiconductor layers 25 in the subsequent process. In some embodiments, the sacrificial layer 25 are made of one or more layers of insulating materials, such as silicon oxide, silicon nitride, silicon oxynitride, SiOC, aluminum oxide, hafnium oxide or any other suitable insulating material. In some embodiments, the sacrificial layers 25 are made of one or more layers of semiconductor material, such as Si, SiGe and Ge. In some embodiments, the semiconductor layer is amorphous or polycrystalline. In other embodiments, the sacrificial layers 25 are made of one or more layers of metallic material, such as metal nitride including TiN and TaN.

In some embodiments, the thickness of the semiconductor layers 25 is in a range from about 5 nm to about 30 nm, and is in a range from about 10 nm to about 20 nm in other embodiments. In some embodiments, the thickness of the sacrificial layers 20 is in a range from about 5 nm to about 30 nm, and is in a range from about 10 nm to about 20 nm in other embodiments. In some embodiments, the thickness of the semiconductor layers 25 is equal to the thickness of the sacrificial layers 20, and in other embodiments, the thickness of the semiconductor layers 25 is greater or smaller than the thickness of the sacrificial layers 20.

Although four semiconductor layers 25 and five sacrificial layers 20 are shown, up to 20 layers each are formed in some embodiments. In some embodiments, the number of layers ranges from 4 to 10 layers each of the semiconductor and sacrificial layers. In some embodiments, a sacrificial layer 20 is directly formed on the first ILD layer 10 and the uppermost layer of the alternate stack is a sacrificial layer 20. In other embodiments, the uppermost layer of the alternate stack is a semiconductor layer 25.

Figure 8B:
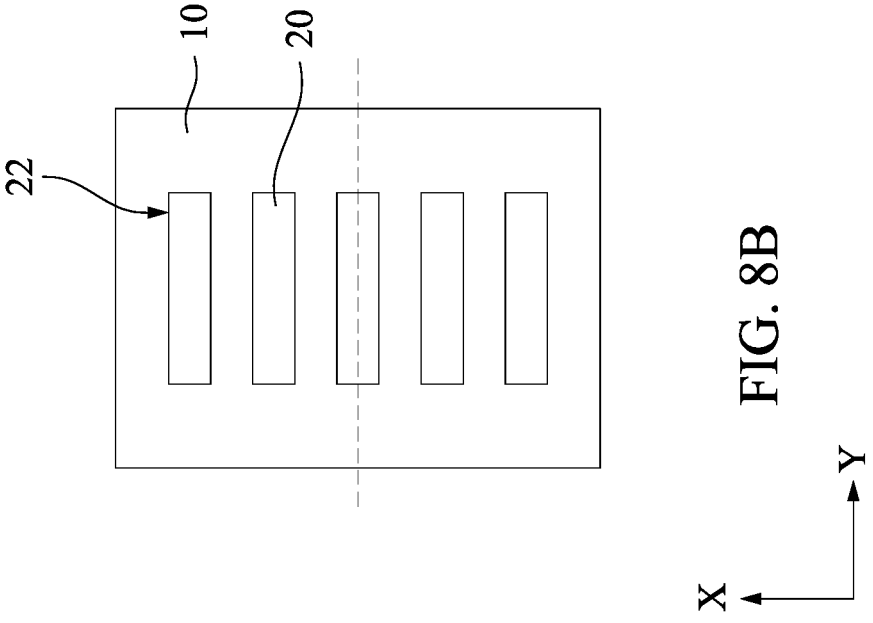
FIGS. 8A and 8B are schematic illustrations of a sequential process of manufacturing a semiconductor device according to an embodiment of the present disclosure.
Figure 8A:
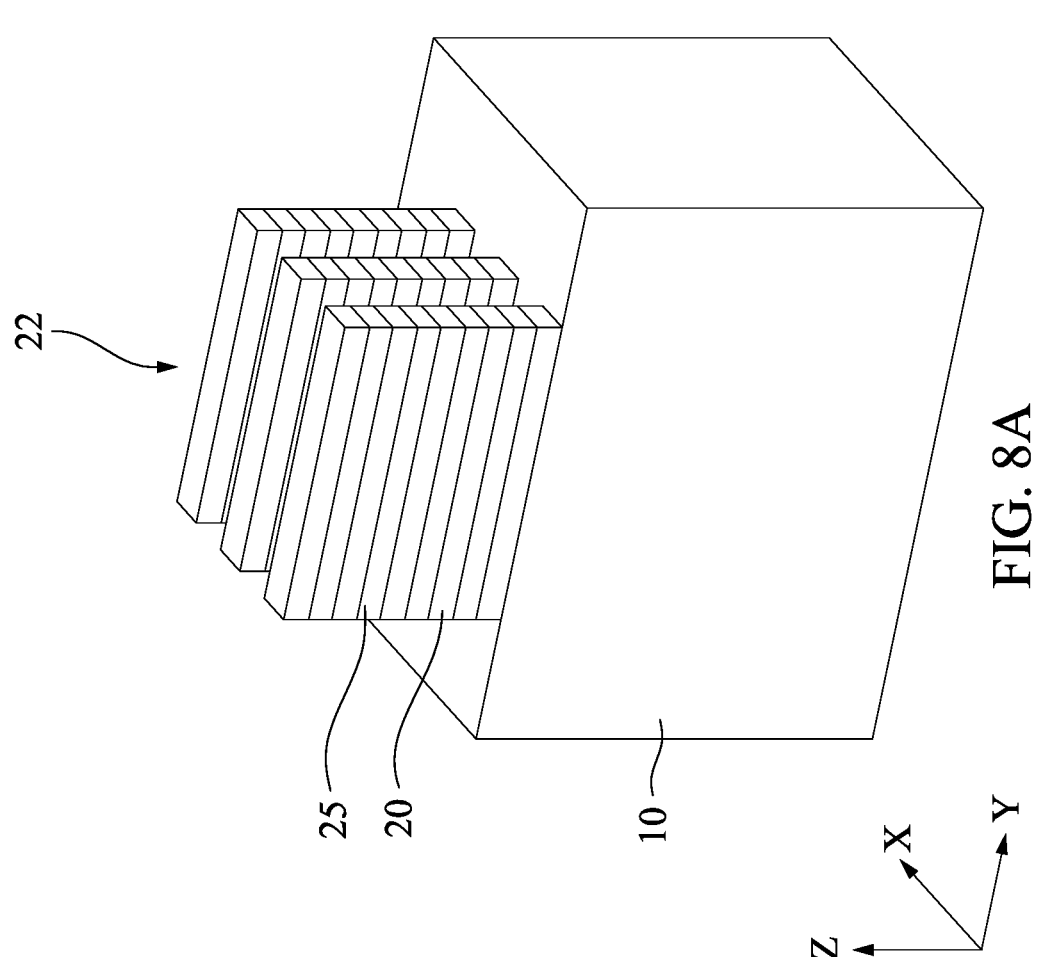

FIGS. 8A and 8B are schematic illustrations of a sequential step of manufacturing a semiconductor device according to an embodiment of the present disclosure. In some embodiments, the alternate stack of the semiconductor layers 25 and sacrificial layers 20 is patterned into fin structures 22.

The fin structures 22 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (a mandrel pattern) is formed over a substrate and patterned using a photolithography process. Spacers are formed alongside the patterned sacrificial layer using a self-aligned process. The sacrificial layer (mandrel pattern) is then removed, and the remaining spacers may then be used to pattern the fin structure 22.

Although five fin structures 22 are shown in FIG. 8B, the number of the fin structures for one TFT is not limited to five. In some embodiments, the number of the fin structures per TFT ranges from 1 to 10 and is in a range from 2 to 5 in other embodiments, depending on driving current requirements. A width of the fin structures 25 is in a range from about 10 nm to about 50 nm in some embodiments, and is in a range from about 15 nm to about 30 nm in other embodiments.

Figure 9B:
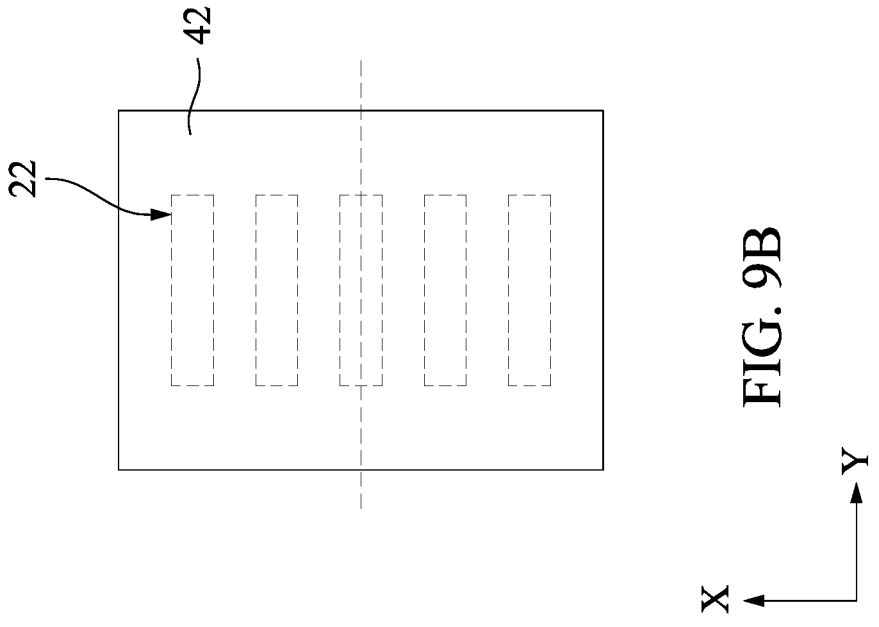
FIGS. 9A and 9B are schematic illustrations of a sequential process of manufacturing a semiconductor device according to an embodiment of the present disclosure.
Figure 9A:
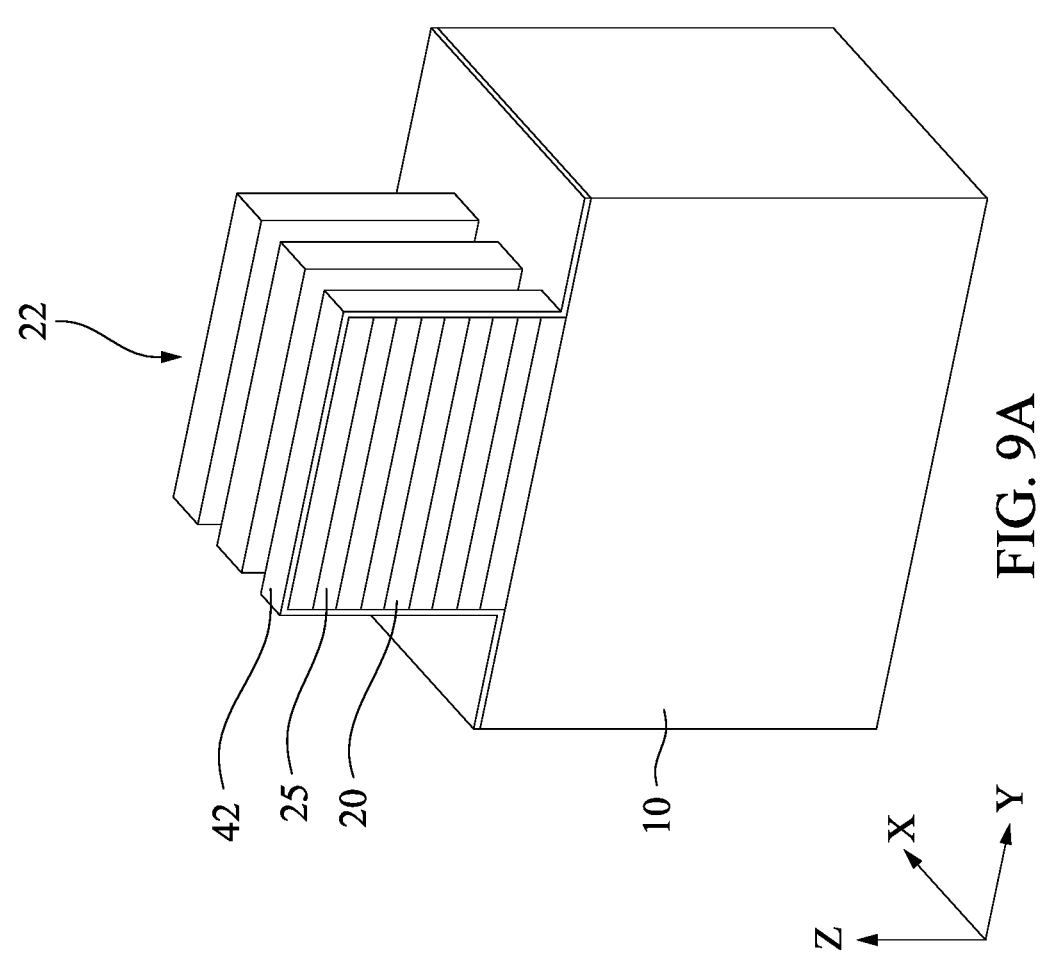

FIGS. 9A and 9B are schematic illustrations of a sequential step of manufacturing a semiconductor device according to an embodiment of the present disclosure. In some embodiments, a sacrificial gate dielectric layer 42 is formed over the fin structures 22 and the ILD layer 20 as shown in FIG. 9A. In some embodiments, the sacrificial gate dielectric layer 42 is made of insulating material such as silicon oxide, silicon nitride, silicon oxynitride, SiOC, aluminum oxide, hafnium oxide or any other suitable insulating material. In other embodiments, no sacrificial gate dielectric layer is formed.

Figure 10B:
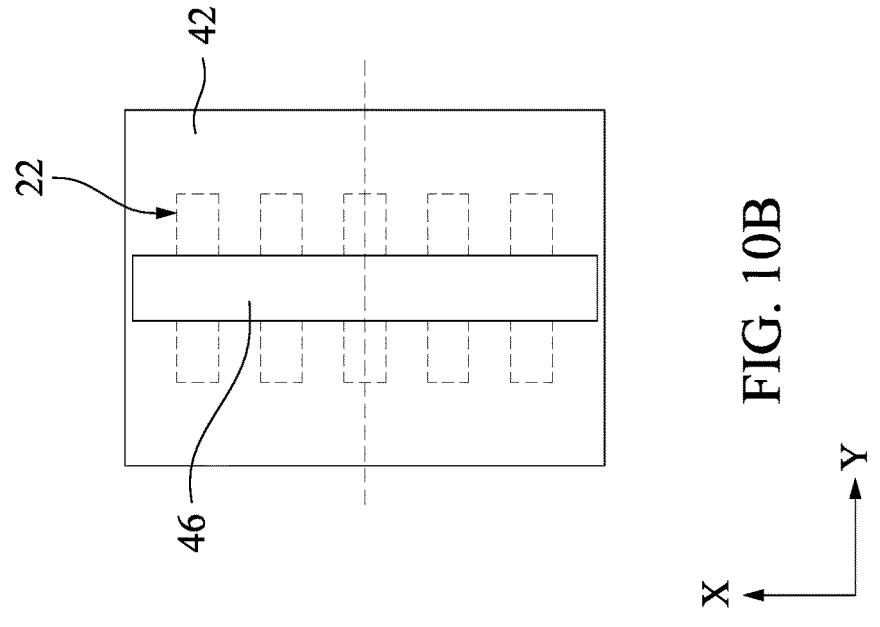
FIGS. 10A and 10B are schematic illustrations of a sequential process of manufacturing a semiconductor device according to an embodiment of the present disclosure.
Figure 10A:
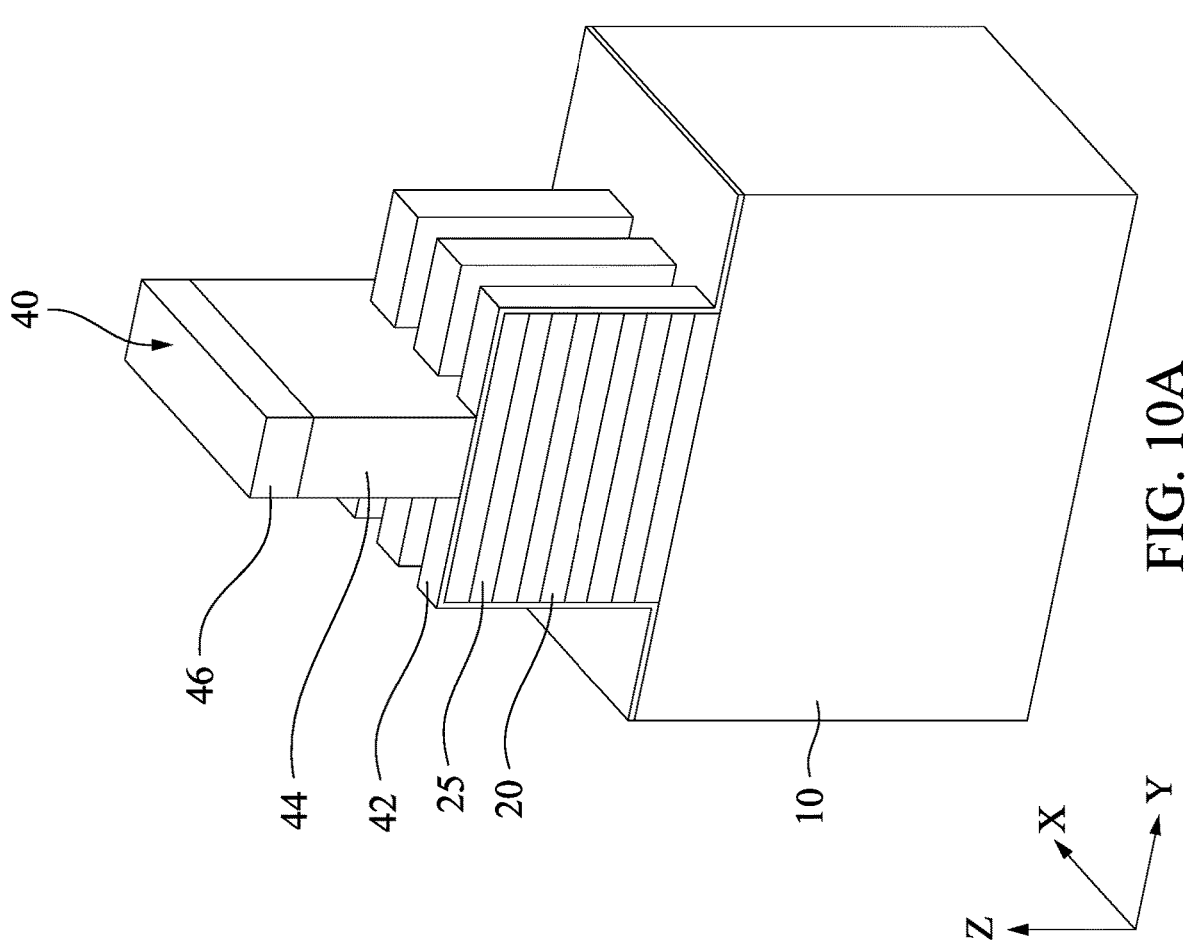

FIGS. 10A and 10B are schematic illustrations of a sequential step of manufacturing a semiconductor device according to an embodiment of the present disclosure. Then, a sacrificial gate structure 40 for a gate replacement technique is formed as shown in FIGS. 10A and 10B. In some embodiments, the sacrificial gate structure includes a sacrificial gate electrode layer 44 and a hard mask layer 46. In some embodiments, the sacrificial gate electrode layer 44 is polycrystalline or amorphous Si, SiGe or Ge. The sacrificial gate electrode layer 44 is formed by chemical vapor deposition (CVD) or any other suitable film formation methods, and a hard mask layer 46 is formed over the sacrificial gate electrode layer 44. In some embodiments, the hard mask layer 46 is made of a silicon nitride based material, such as silicon nitride, SiON or SiCN or a silicon oxide based material, such as silicon oxide. After the hard mask layer 46 is formed, by using one or more lithography and etching operations, the hard mask layer 46 is patterned. Then, by using the patterned hard mask layer 46 as an etching mask, the deposited sacrificial gate electrode layer 44 is patterned. In some embodiments, one or more dummy gate structures for suppressing process variations and/or to improve pattern fidelity are formed to surround the sacrificial gate structures for a functional transistor.

Figure 11B:
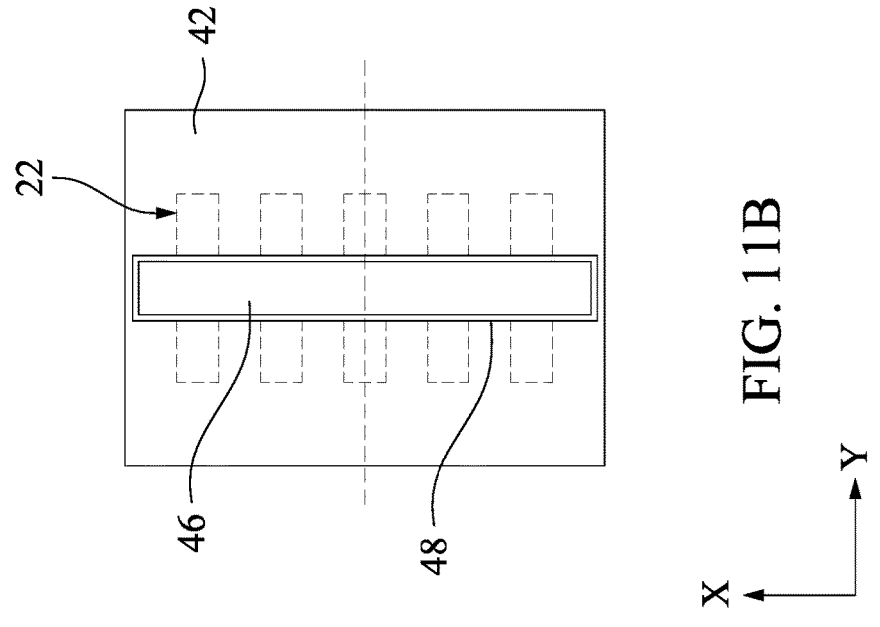
FIGS. 11A and 11B are schematic illustrations of a sequential process of manufacturing a semiconductor device according to an embodiment of the present disclosure.
Figure 11A:
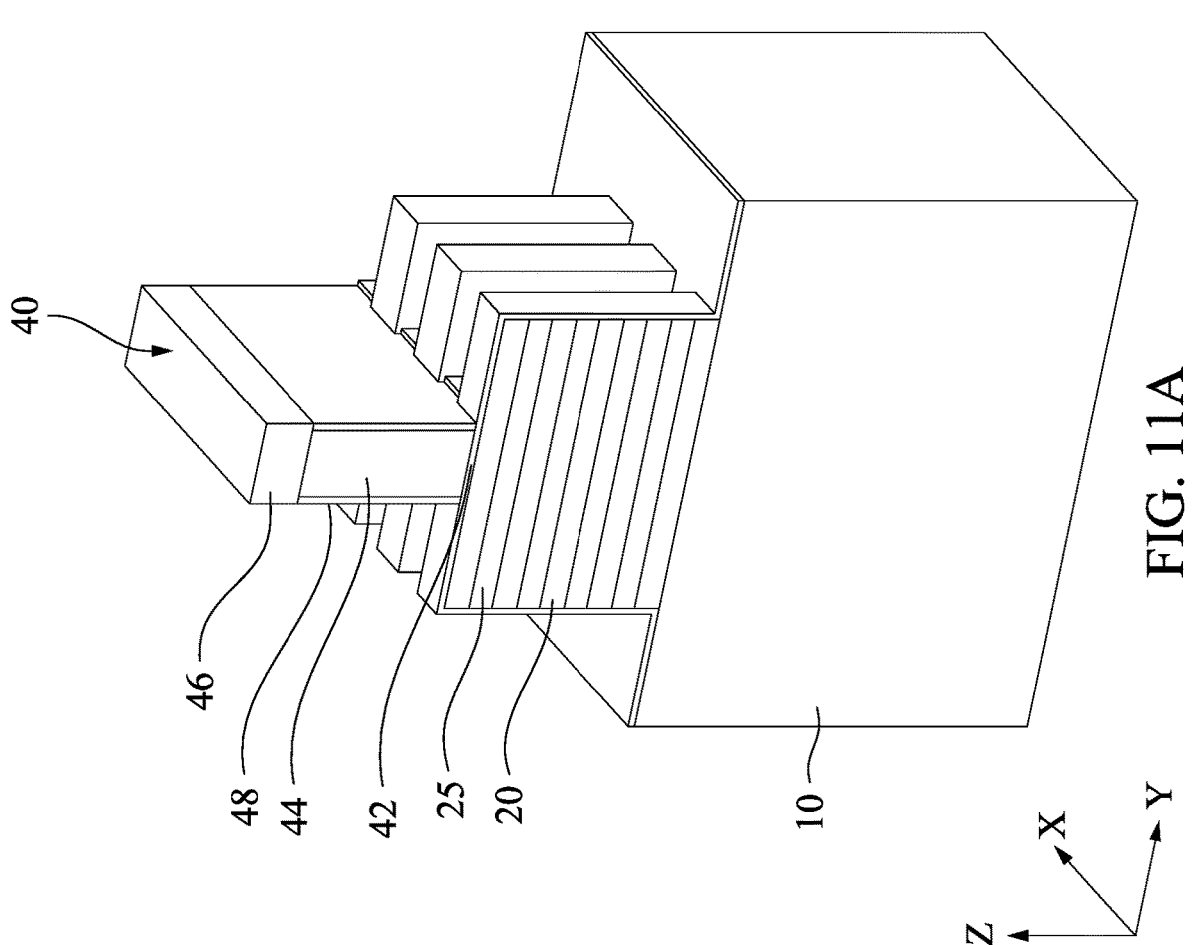

FIGS. 11A and 11B are schematic illustrations of a sequential step of manufacturing a semiconductor device according to an embodiment of the present disclosure. Subsequently, as shown in FIGS. 11A and 11B, gate sidewall spacers 48 are formed on side faces of the sacrificial gate structure 40. A blanket layer of an insulating material for first sidewall spacers is conformally formed by using CVD or other suitable methods. The blanket layer is deposited in a conformal manner so that it is formed to have substantially equal thicknesses on vertical surfaces, such as the sidewalls, horizontal surfaces, and the top of the sacrificial gate structure 40. In some embodiments, the blanket layer is deposited to a thickness in a range from about 2 nm to about 30 nm. In one embodiment, the insulating material of the blanket layer is different from the materials of the sacrificial gate structure, and is made of a silicon nitride-based material, such as silicon nitride, SiON, SiOCN or SiCN and combinations thereof. In some embodiments, the blanket layer is made of silicon nitride. The sidewall spacers are formed on opposite side faces of the sacrificial gate structure, by anisotropic etching. In some embodiments, the gate side wall spacers 48 are formed on opposing side faces of the hard mask layer 46. In some embodiments, sidewall spacers are formed on side faces of the fin structures 22.

Figure 12B:
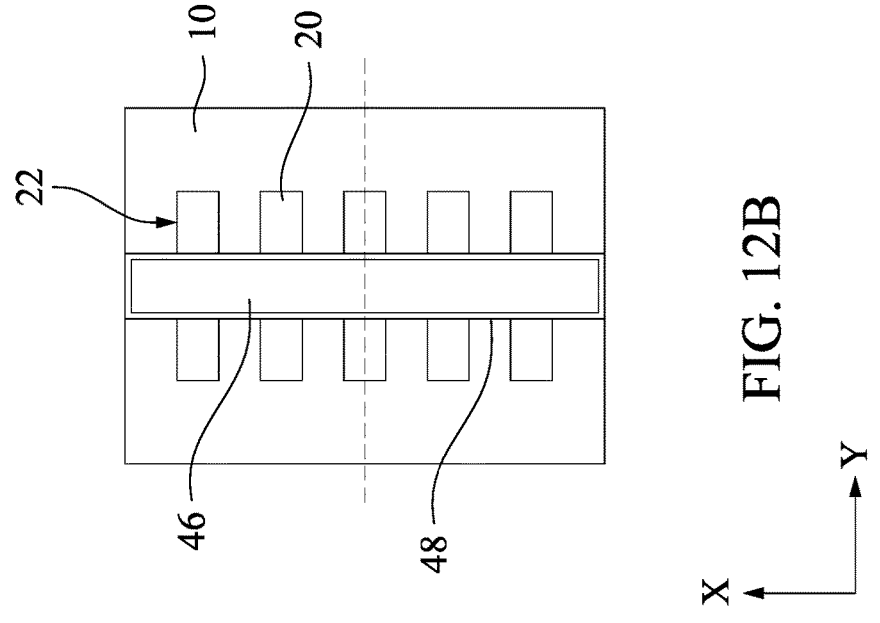
FIGS. 12A and 12B are schematic illustrations of a sequential process of manufacturing a semiconductor device according to an embodiment of the present disclosure.
Figure 12A:
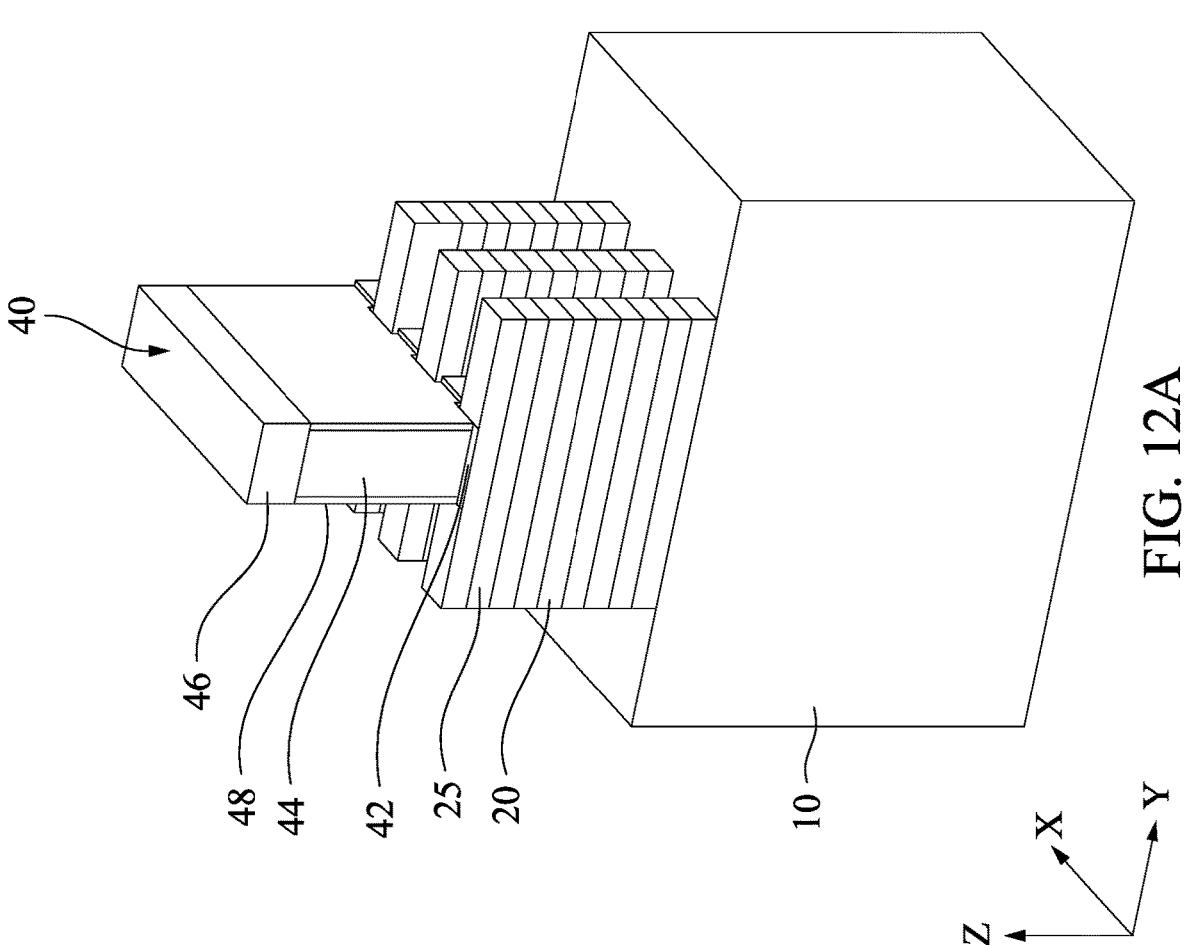

FIGS. 12A and 12B are schematic illustrations of a sequential step of manufacturing a semiconductor device according to an embodiment of the present disclosure. Then, the sacrificial gate dielectric layer 42 is removed and the fin structures 22 are exposed, as shown in FIGS. 12A and 12B. As shown in FIG. 12A, the sacrificial gate dielectric layer 42 remains under the sacrificial gate structure 40 and the gate sidewall spacers 48.

Figures 13A, 13B:
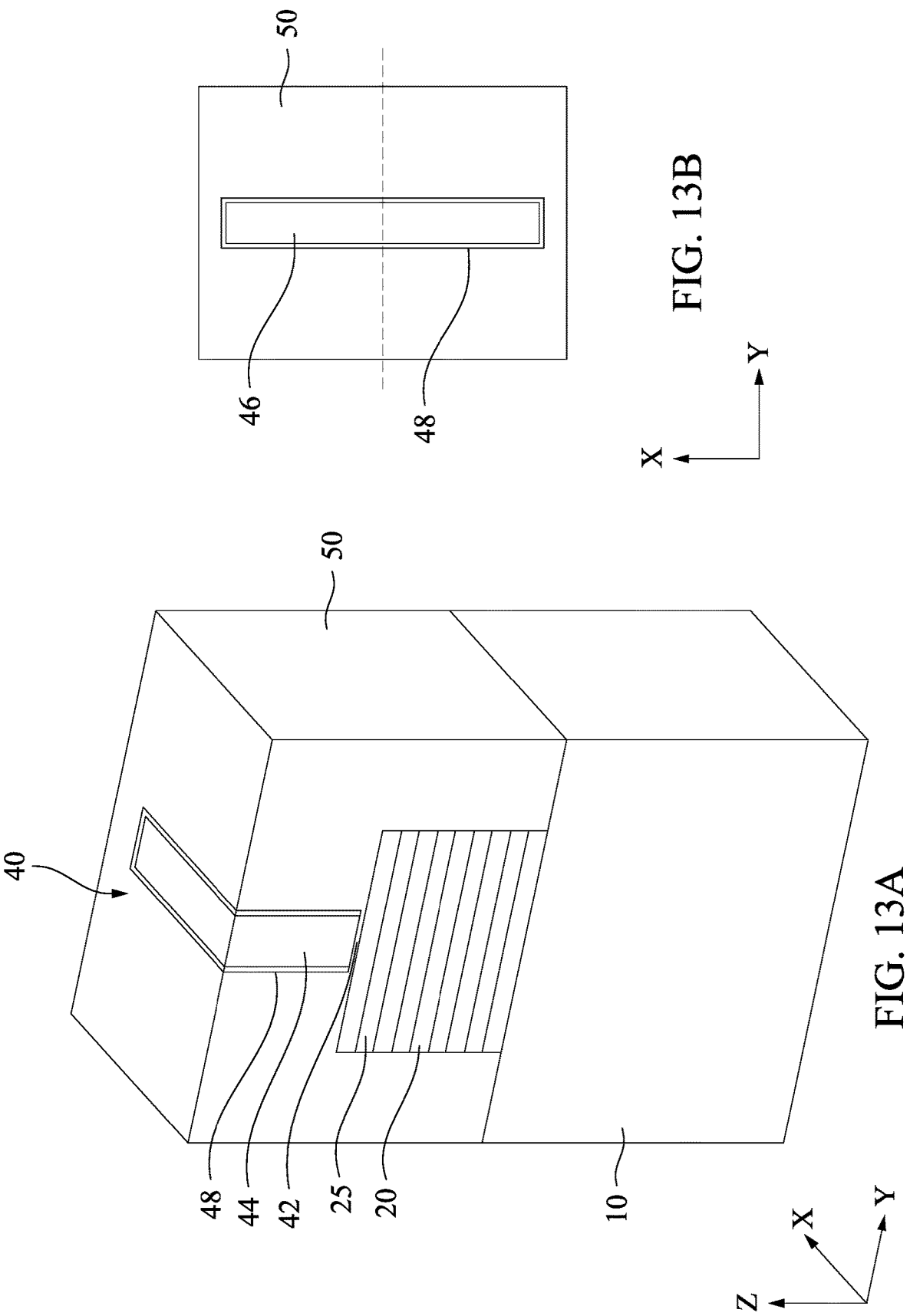
FIGS. 13A and 13B are schematic illustrations of a sequential process of manufacturing a semiconductor device according to an embodiment of the present disclosure.

FIGS. 13A and 13B are schematic illustrations of a sequential step of manufacturing a semiconductor device according to an embodiment of the present disclosure. Then, a second ILD layer 50 is formed over the sacrificial gate structure 40 and the fin structures 22, as shown in FIGS. 13A and 13B. The materials for the second ILD layer 50 include compounds comprising Si, 0, C and/or H, such as silicon oxide, SiCOH and SiOC. Organic materials, such as polymers, may be used for the second ILD layer 50. In some embodiments, the second ILD layer 50 is made of the same material as the first ILD layer 10. After the second ILD layer 50 is formed, a planarization operation, such as CMP, is performed, so that the top portion of the sacrificial gate electrode layer 44 is exposed, as shown in FIGS. 13A and 13B.

Figures 14A, 14B:
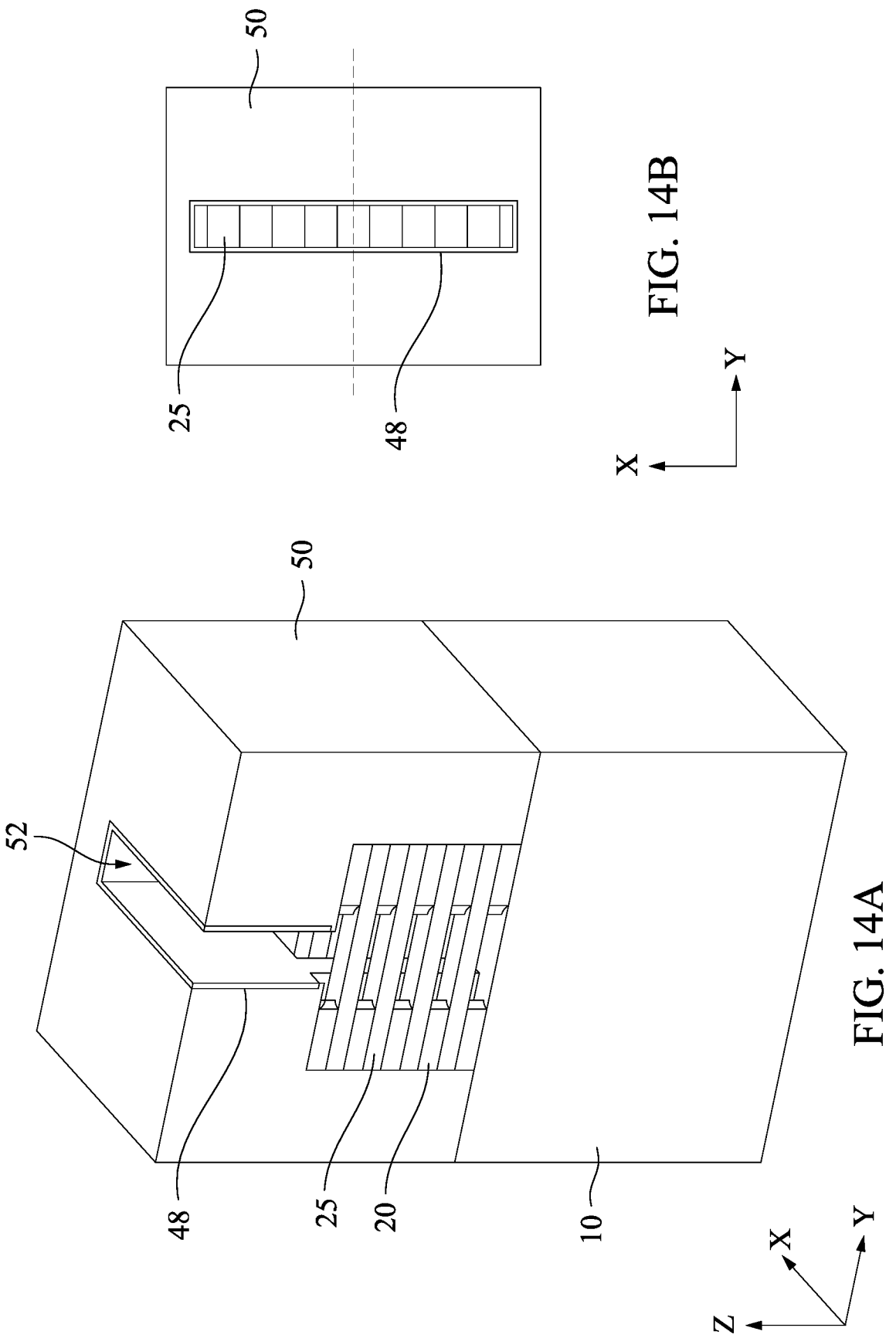
FIGS. 14A and 14B are schematic illustrations of a sequential process of manufacturing a semiconductor device according to an embodiment of the present disclosure.

FIGS. 14A and 14B are schematic illustrations of a sequential step of manufacturing a semiconductor device according to an embodiment of the present disclosure. Subsequently, the sacrificial gate electrode layer 44 and the sacrificial gate dielectric layer 42 are removed, thereby forming a gate space 52, as shown in FIGS. 14A and 14B. The sacrificial gate electrode layer 44 can be removed using plasma dry etching and/or wet etching. In some embodiments, when the sacrificial gate electrode layer 44 is made of polycrystalline or amorphous Si, a tetramethylammonium hydroxide solution (TMAH) is used as a wet etchant. The sacrificial gate dielectric layer 42 is also removed by suitable wet/dry etching.

Further, as shown in FIGS. 14A and 14B, the sacrificial layers 20 are also removed under the gate space 52. When the sacrificial layers 20 and the sacrificial gate dielectric layer 42 are made of the same or similar materials, the removal operation (e.g., wet etching) of the sacrificial gate dielectric layer 42 also removes the sacrificial layer 20. When the sacrificial layers 20 and the sacrificial gate dielectric layer 42 are made of different material from each other, two or more etching operations are performed to remove the sacrificial gate dielectric layer 42 and the sacrificial layers 20 sequentially. By removing the sacrificial layers 20, channel regions of the semiconductor layers 25 are released in the gate space 52 as semiconductor nano-sheets.

Figures 15A, 15B:
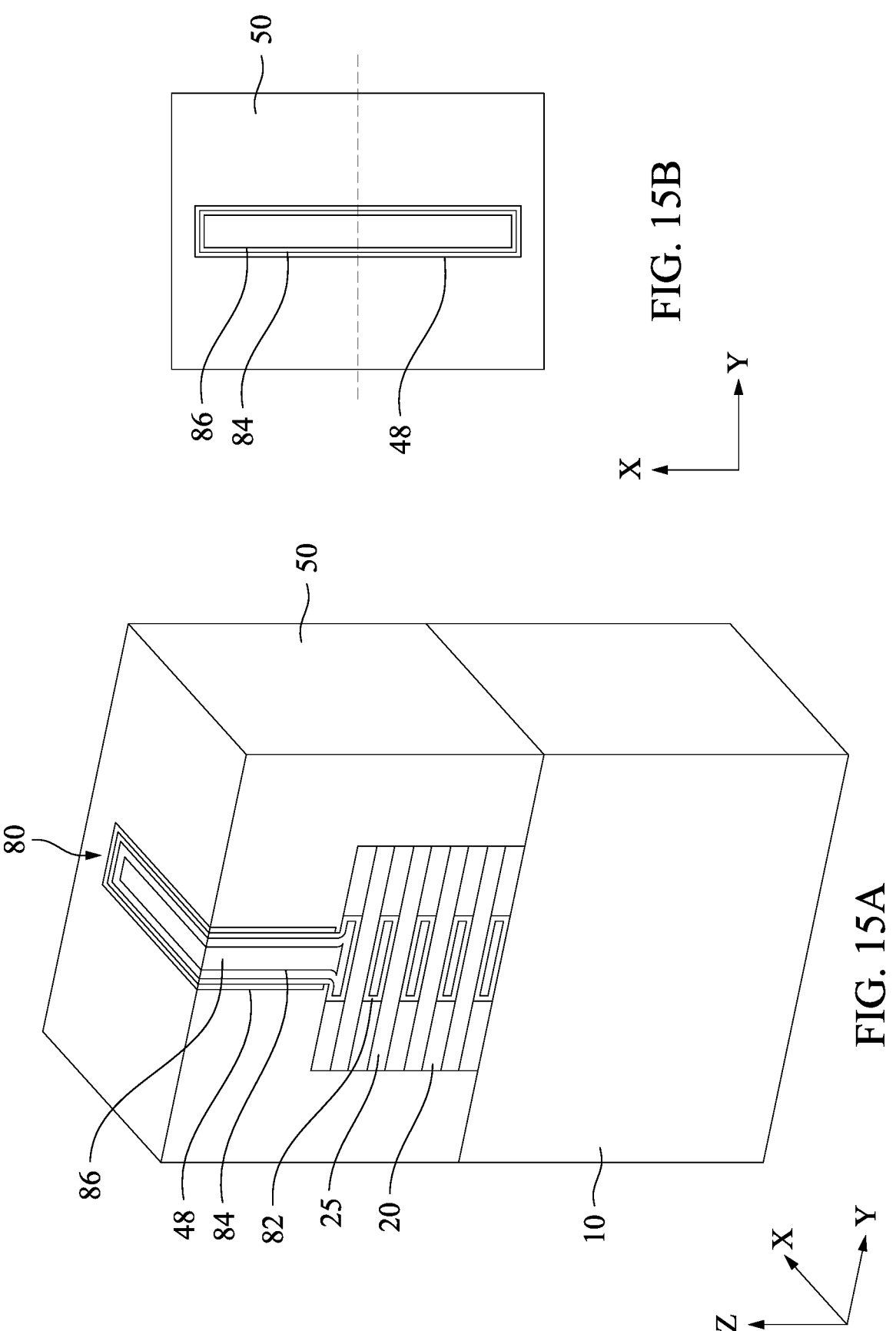
FIGS. 15A and 15B are schematic illustrations of a sequential process of manufacturing a semiconductor device according to an embodiment of the present disclosure.

FIGS. 15A and 15B are schematic illustrations of a sequential step of manufacturing a semiconductor device according to an embodiment of the present disclosure. Then, as shown in FIGS. 15A and 15B, a gate dielectric layer 82 and a gate electrode layer 80 are formed in the gate space 52. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel region and the dielectric material. The gate dielectric layer 82 may be formed by CVD, ALD or any suitable methods. In one embodiment, the gate dielectric layer 82 is formed using a highly conformal deposition process such as ALD in order to ensure the formation of a gate dielectric layer having a uniform thickness around each channel region. The thickness of the gate dielectric layer 82 is in a range from about 1 nm to about 20 nm in some embodiments and is in a range from about 2 nm to about 10 nm in other embodiments.

The metal gate electrode layer 80 includes one or more work function adjustment layers 84 and a body metal gate electrode layer 86 in some embodiments. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. The work function adjustment layer may be formed by ALD, PVD, CVD, e-beam evaporation, or other suitable process. Further, the work function adjustment layer 84 may be formed separately for the nFET and the pFET, which may use different metal layers. The body gate electrode layer is formed to surround each oxide semiconductor nano-sheet (channel region). The body gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The body gate electrode layer may be formed by CVD, ALD, electro-plating, or other suitable method. The metals for the gate dielectric layer 82 and the gate electrode layer 80 are also deposited over the upper surface of the second ILD layer 50. The material for the gate electrode layer 80 formed over the second ILD layer 50 is then planarized by using, for example, CMP, until the top surface of the second ILD layer 50 is revealed, as shown in FIGS. 15A and 15B. In some embodiments, after the planarization operation, the metal gate electrode layer is recessed and a cap insulating layer (not shown) is formed over the recessed gate electrode layer. The cap insulating layer includes one or more layers of a silicon nitride-based material, such as silicon nitride. The cap insulating layer can be formed by depositing an insulating material followed by a planarization operation.

Figures 16A, 16B:
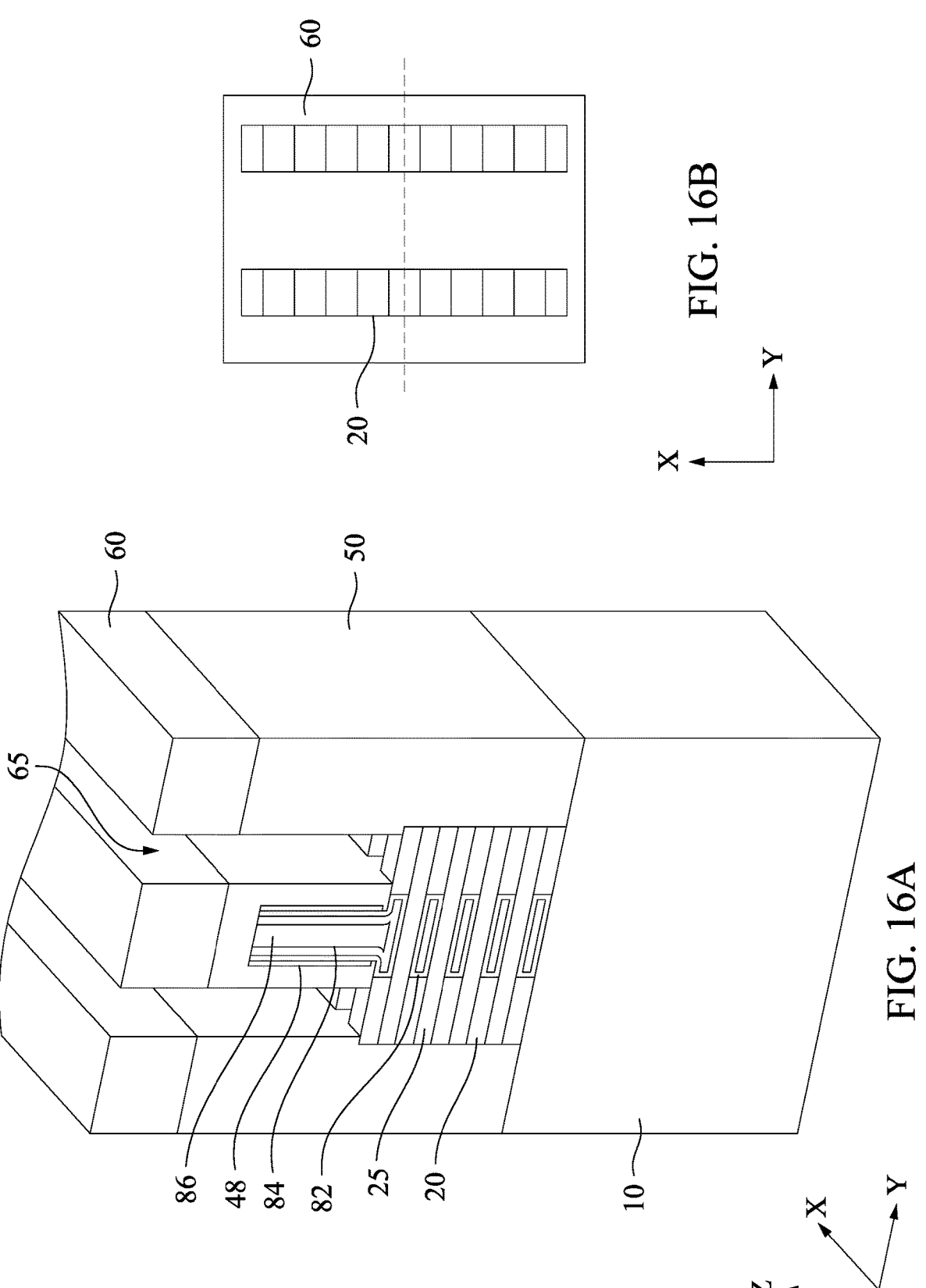
FIGS. 16A and 16B are schematic illustrations of a sequential process of manufacturing a semiconductor device according to an embodiment of the present disclosure.

FIGS. 16A and 16B are schematic illustrations of a sequential step of manufacturing a semiconductor device according to an embodiment of the present disclosure. Further, a third ILD layer 60 is formed over the second ILD layer 50, and contact holes 65 for source/drain contact are formed in the third and second ILD layers, as shown in FIGS. 16A and 16B. The materials for the third ILD layer 60 include compounds comprising Si, 0, C and/or H, such as silicon oxide, SiCOH and SiOC. Organic materials, such as polymers, may be used for the third ILD layer 60. In some embodiments, the third ILD layer 60 is made of the same material as the second ILD layer and/or the first ILD layer 10. In some embodiments, the third ILD layer 60 functions as a hard mask layer for etching the second ILD layer.

Figures 17A, 17B:
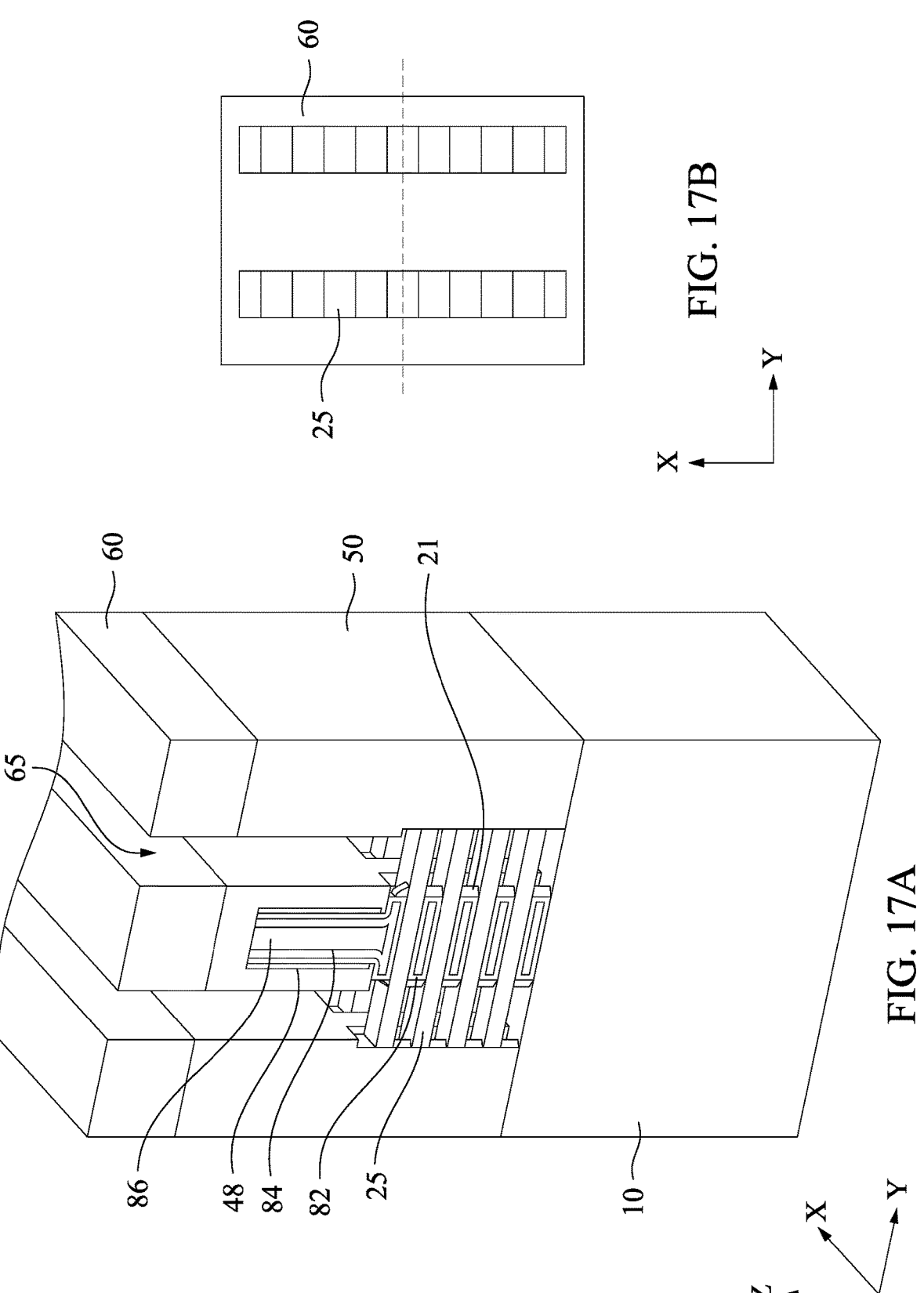
FIGS. 17A and 17B are schematic illustrations of a sequential process of manufacturing a semiconductor device according to an embodiment of the present disclosure.

FIGS. 17A and 17B are schematic illustrations of a sequential step of manufacturing a semiconductor device according to an embodiment of the present disclosure. After the contact holes 65 are formed, the sacrificial layers 20 are removed under the contact holes 65, thereby source/drain regions of the semiconductor layers 20 are released, as shown in FIG. 17A.

In some embodiments, part of the sacrificial layers 20 remain as inner spacers 21. When the sacrificial layers 20 remain as the inner spacers 21, the sacrificial layers 20 are made of an insulating material in some embodiments. In other embodiments, the sacrificial layers 20 are fully removed.

Figures 18A, 18B:
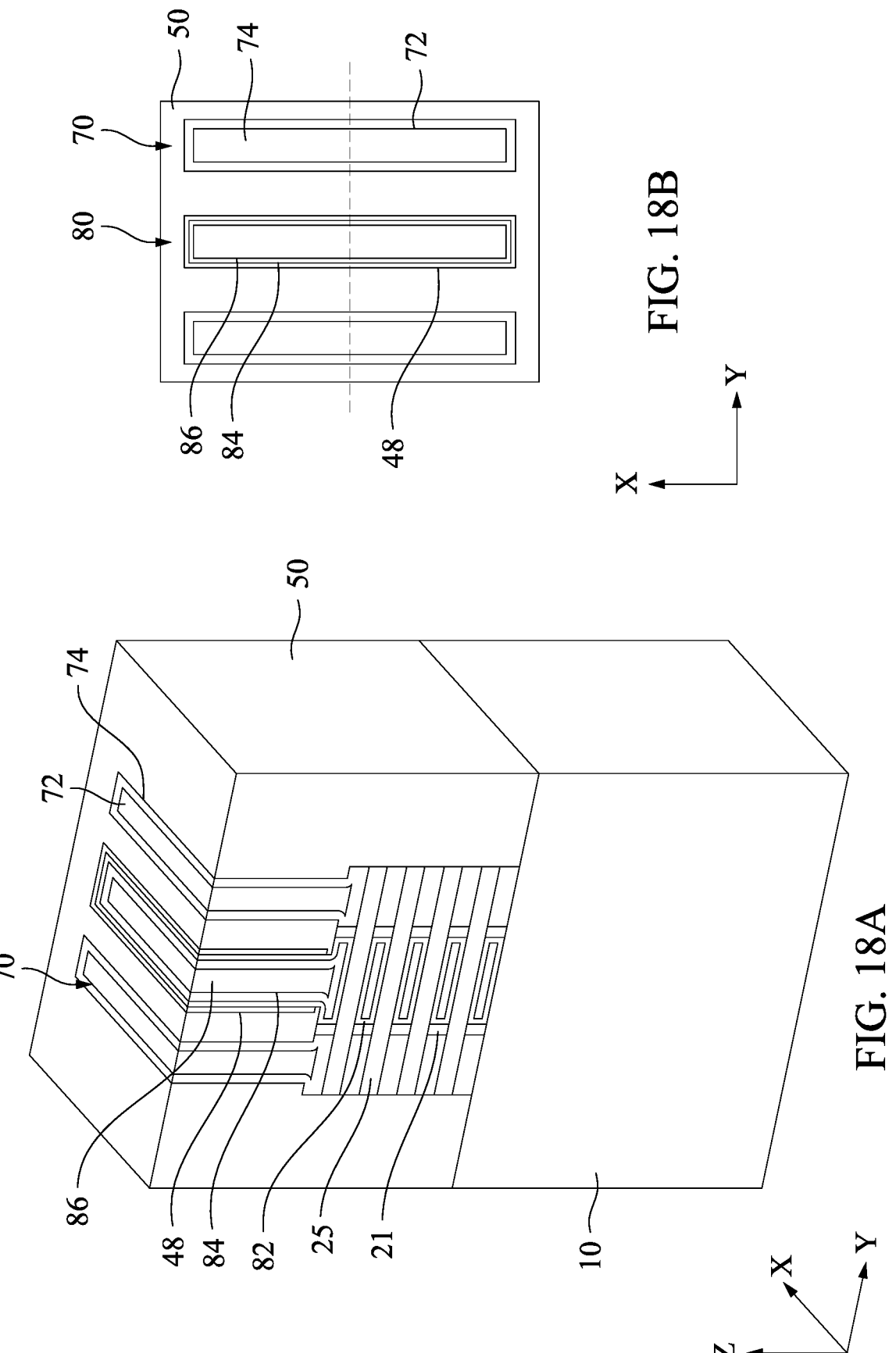
FIGS. 18A and 18B are schematic illustrations of a sequential process of manufacturing a semiconductor device according to an embodiment of the present disclosure.
Figure 19B:
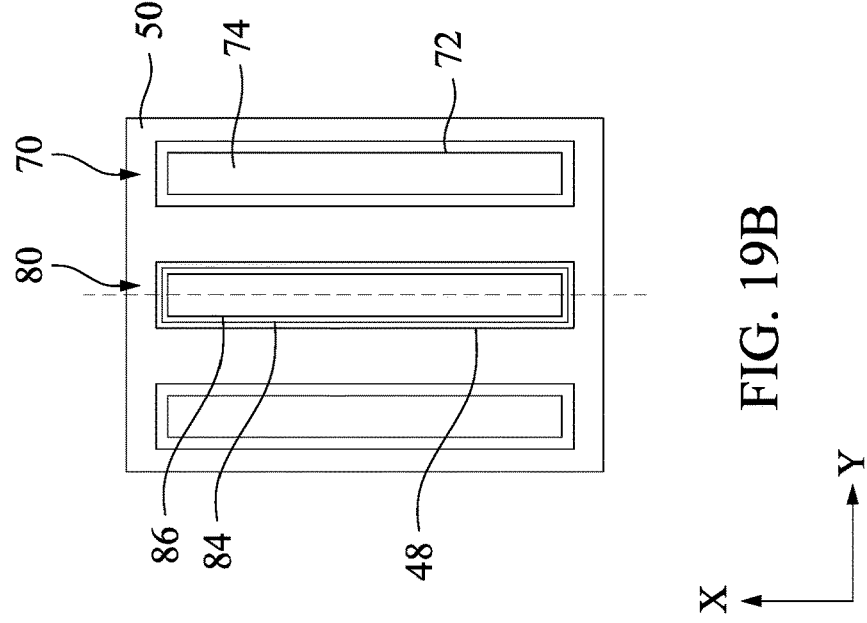
FIGS. 19A and 19B are schematic illustrations of a sequential process of manufacturing a semiconductor device according to an embodiment of the present disclosure.
Figure 19A:
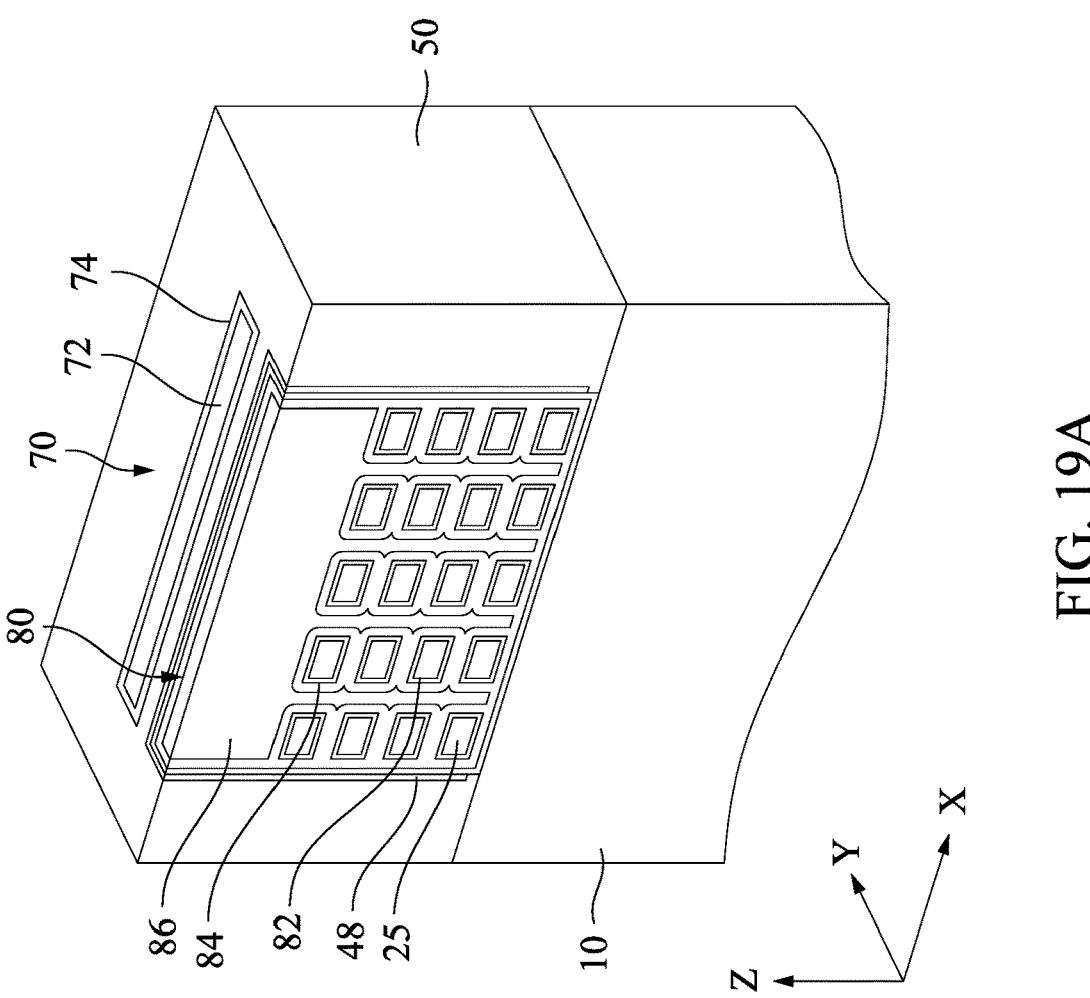
Figure 20B:
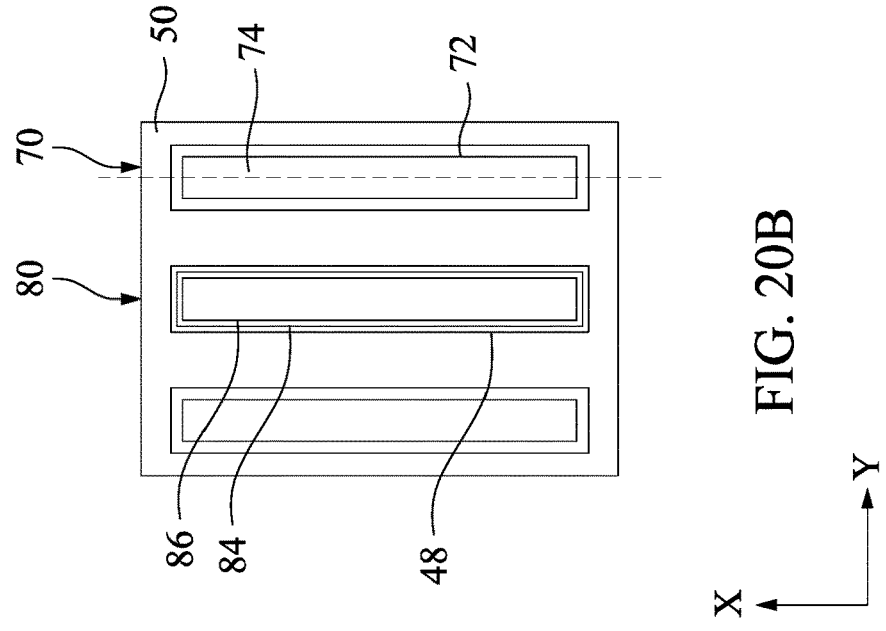
FIGS. 20A and 20B are schematic illustrations of a sequential process of manufacturing a semiconductor device according to an embodiment of the present disclosure.
Figure 20A:
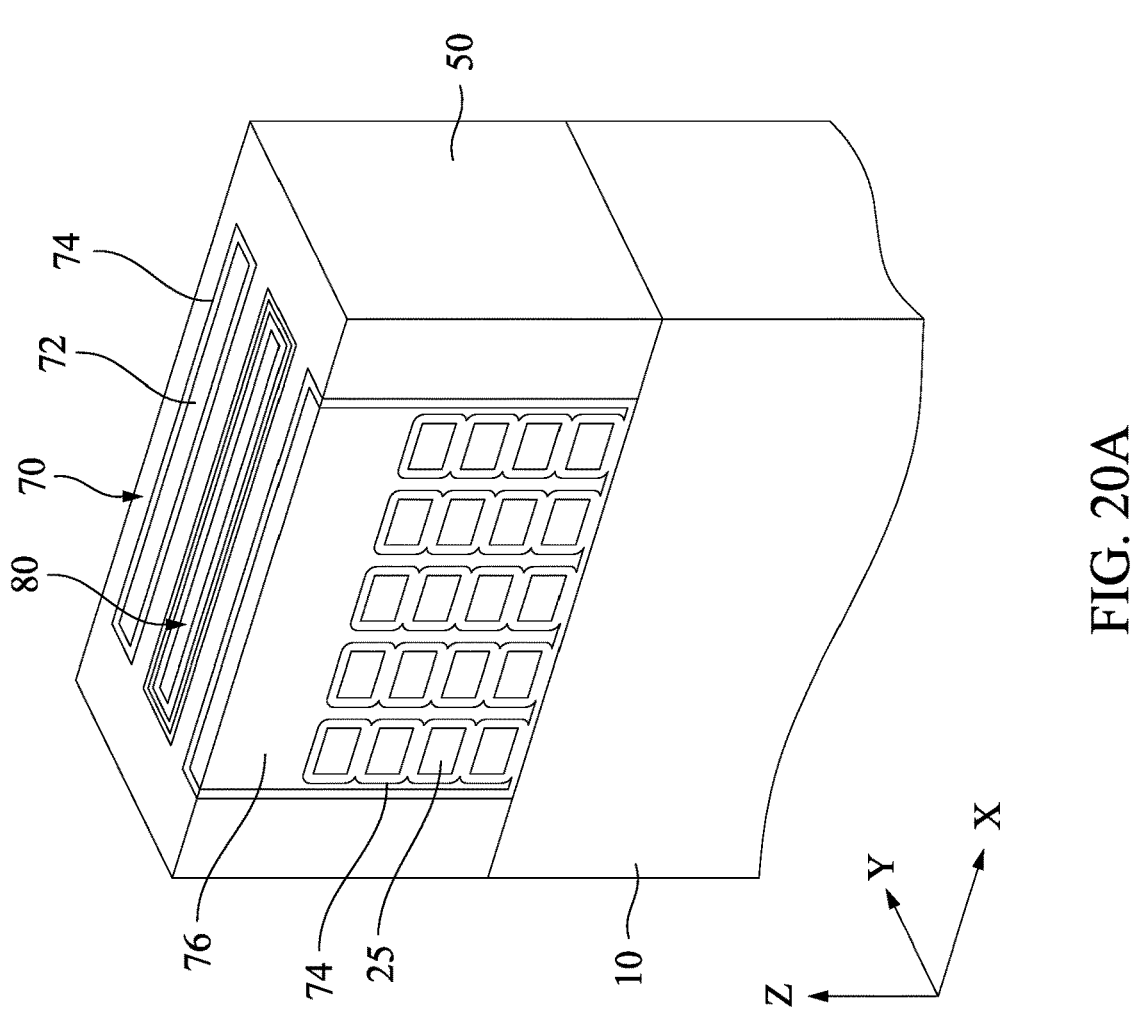

FIGS. 18A-20B are schematic illustrations of a sequential step of manufacturing a semiconductor device according to an embodiment of the present disclosure. FIG. 18A shows a cross section cutting along the source-to-drain direction (Y direction), FIG. 19A shows a cross section cutting along the gate extending direction (X direction) of the gate electrode, and FIG. 20A shows a cross section cutting along the X direction of a source/drain contact.

As shown in FIGS. 18A-20B, source/drain contacts 70 are formed in the contact holes 65. One or more layers of conductive materials are formed in and over the contact holes then a planarization operation, such as a CMP operation, is performed to form conductive contacts 70. In some embodiments, the source/drain contact 70 includes a liner or a barrier layer 72 and a body contact layer 74, as shown in FIG. 4. In some embodiments, the liner layer 72 is made of one or more of Ti, TiN, Ta, and TaN, and the body contact layer 74 is made of one or more of W, Cu, Ti, Ag, Al, Mn, Co, Pd, Ni, Re, Ir, Ru, Pt, and Zr. As shown in FIG. 20A, at least the liner layer 72 wraps around the source/drain regions of the semiconductor layers (nano-sheet) 25. In other embodiments, the body contact layer 74 also wraps around the source/drain regions.

It is understood that the TFT undergoes further processes to form various features such as contacts/vias, interconnect metal layers, dielectric layers, passivation layers, etc.

FIGS. 21A-22B shows sequential operations for manufacturing a semiconductor device according to another embodiment of the present disclosure. It is understood that additional operations can be provided before, during, and after the processes shown by FIGS. 21A-22B, and some of the operations described below can be replaced or eliminated, for additional embodiments of the method. The manufacturing operations shown in FIGS. 21A-22B correspond to the TFT structure shown in FIG. 5.

Figures 21A, 21B:
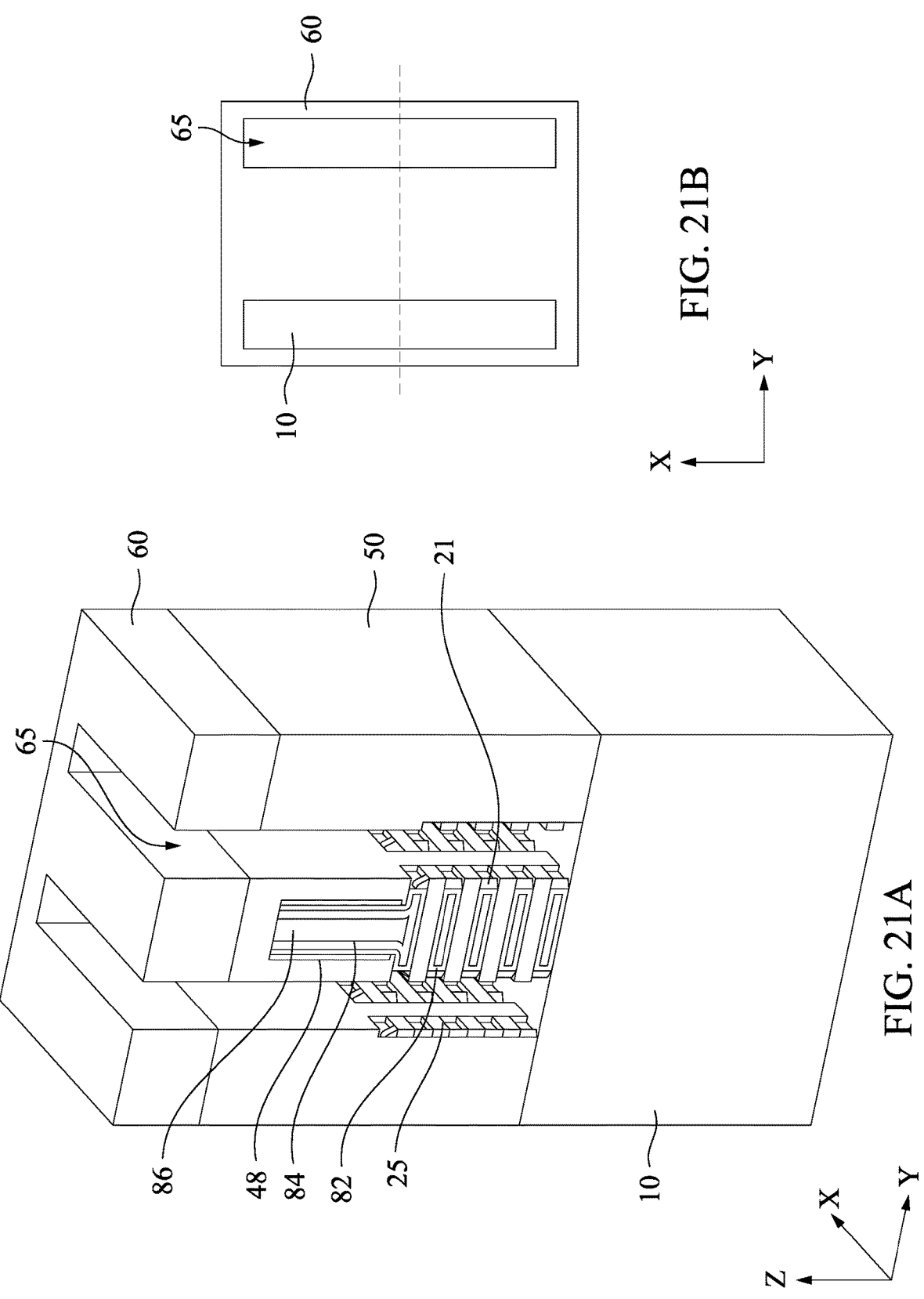
FIGS. 21A and 21B are schematic illustrations of a sequential process of manufacturing a semiconductor device according to an embodiment of the present disclosure.
Figures 22A, 22B:
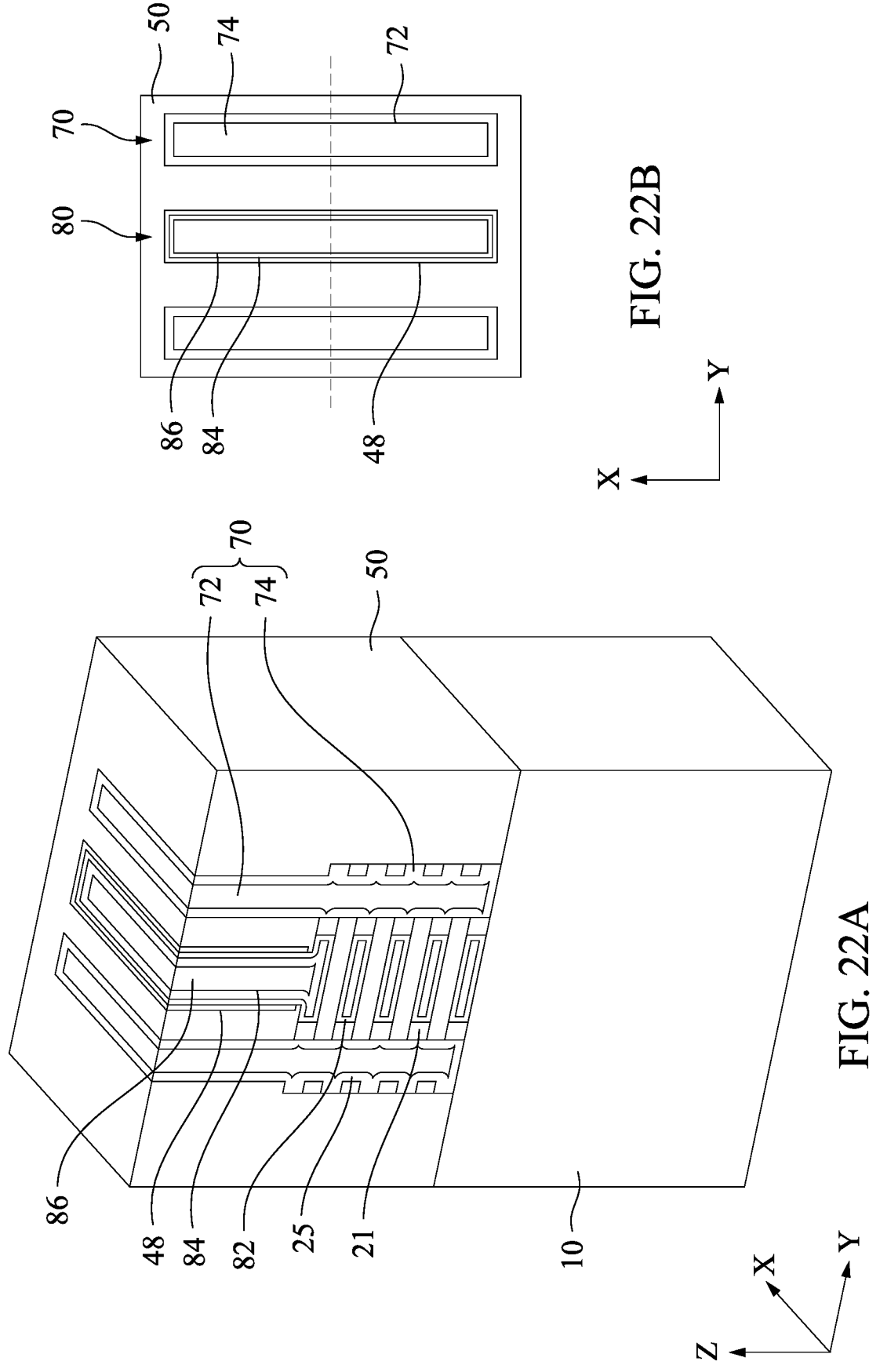
FIGS. 22A and 22B are schematic illustrations of a sequential process of manufacturing a semiconductor device according to an embodiment of the present disclosure.

After the contact holes 65 for the source/drain contacts are formed, both the semiconductor layer 25 and the sacrificial layers 20 are removed in the contact holes 65, as shown in FIGS. 21A and 21B. Then, similar to FIGS. 20A and 20B, source/drain contacts 70 are formed, as shown in FIGS. 22A and 22B.

Figure 23:
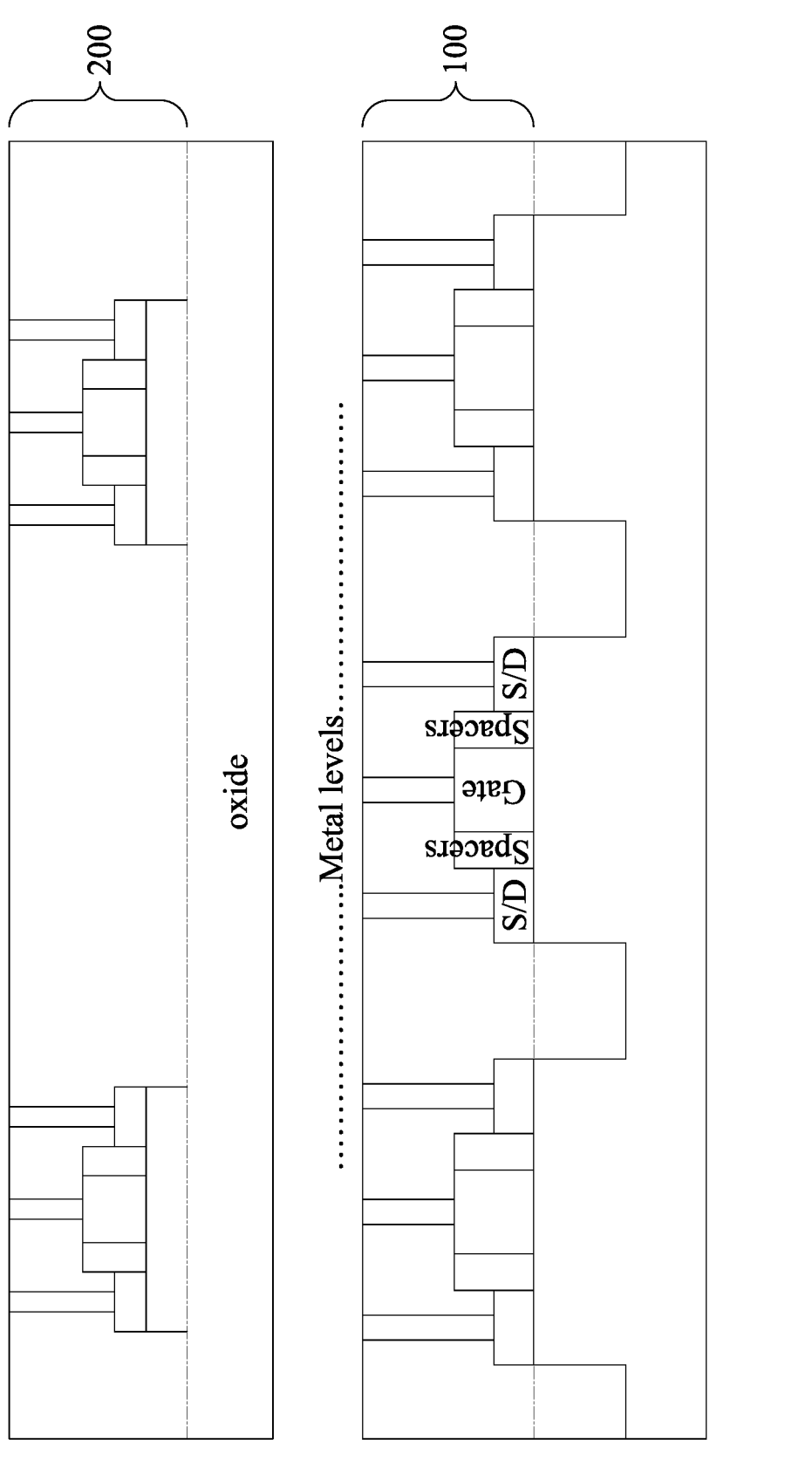
FIG. 23 shows a cross sectional view of a semiconductor FET device according to an embodiment of the present disclosure.

FIG. 23 shows a cross sectional view of a semiconductor device according to an embodiment of the present disclosure. As shown in FIG. 23, a lower layer device 100 is formed over a substrate. The lower layer devices 100 includes one or more fin field effect transistors (FinFETs), gate-all-around FET (GAA FET), planar FETs, vertical FETs or any other electronic devices. FIG. 23 also shows an upper layer device 200 disposed over the lower layer device 100. In some embodiments, one or more ILD layers, metal wiring layers and/or via contacts are disposed between the lower layer device 100 and the upper layer device 200. In some embodiments, the upper layer device 200 includes one or more TFTs manufactured by the aforementioned embodiments of the present disclosure.

In the present embodiments, since a power switching circuit for switching power supply from the main power supply (VDD or VSS) to the local power supply (VVDD or VVSS) and power supply wirings are formed by using an oxide semiconductor such as IGZO. Accordingly, it is possible to provide the power switching circuit at the BEOL circuit level.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a stacked structure including semiconductor layers and sacrificial layers are alternately stacked is formed, a sacrificial gate structure is formed over the stacked structure, a dielectric layer is formed over the sacrificial gate structure, the sacrificial gate structure is removed, thereby forming a gate space, the sacrificial layers are removed in the gate space, thereby releasing the semiconductor layers, a gate structure wrapping around the semiconductor layers is formed. The semiconductor layers are made of an oxide semiconductor material. In one or more of the foregoing and/or following embodiments, the oxide semiconductor material includes one selected from the group consisting of indium gallium zinc oxide (IGZO), c-axis aligned crystal (CAAC)-IGZO, ZnO, $In_2O_3$, $Ga_2O_3$, and ZnON. In one or more of the foregoing and/or following embodiments, the oxide semiconductor material includes amorphous indium gallium zinc oxide (IGZO). In one or more of the foregoing and/or following embodiments, the sacrificial layer includes one selected from the group consisting of an insulating material, an amorphous or polycrystalline semiconductor material, and a metal nitride material. In one or more of the foregoing and/or following embodiments, the stacked structure is formed on an insulating material layer. In one or more of the foregoing and/or following embodiments, the insulating material layer covers transistors formed over a semiconductor substrate. In one or more of the foregoing and/or following embodiments, the stacked structure is formed by alternately forming the semiconductor layers and the sacrificial layers on an insulating material layer, and patterning the semiconductor layers and the sacrificial layers into one or more fin structures.

In accordance with another aspect of the present disclosure, in a method of manufacturing a semiconductor device, a fin structure including semiconductor layers and sacrificial layers are alternately stacked is formed over a first dielectric layer, a sacrificial gate structure is formed over the fin structure, gate sidewall spacers are formed on opposing side faces of the sacrificial gate structure, a second dielectric layer is formed over the sacrificial gate structure and the fin structure, the sacrificial gate structure are removed, thereby forming a gate space, the sacrificial layers are removed in the gate space, thereby releasing channel regions of the semiconductor layers, a gate structure wrapping around the channel regions of the semiconductor layers is formed, a third dielectric layer is formed, a contact opening is formed in the third dielectric layer and the second dielectric layer, the sacrificial layers are removed in the contact opening, thereby releasing source/drain regions of the semiconductor layers, and a source/drain contact wrapping around the source/drain regions of the semiconductor layers is formed. The semiconductor layers are made of an oxide semiconductor material. In one or more of the foregoing and/or following embodiments, the oxide semiconductor material includes one selected from the group consisting of indium gallium zinc oxide (IGZO), c-axis aligned crystal (CAAC)-IGZO, ZnO, $In_2O_3$, $Ga_2O_3$, and ZnON. In one or more of the foregoing and/or following embodiments, the oxide semiconductor material includes amorphous indium gallium zinc oxide (IGZO). In one or more of the foregoing and/or following embodiments, the sacrificial layer includes one selected from the group consisting of as silicon oxide, silicon nitride, silicon oxynitride, SiOC, aluminum oxide, hafnium oxide. In one or more of the foregoing and/or following embodiments, the sacrificial layer includes one selected from the group consisting of amorphous or polycrystalline Si, SiGe and Ge. In one or more of the foregoing and/or following embodiments, the sacrificial layer includes one selected from the group consisting of TiN and TaN. In one or more of the foregoing and/or following embodiments, the first dielectric layer covers transistors formed over a semiconductor substrate. In one or more of the foregoing and/or following embodiments, in the removing the sacrificial layers in the contact opening, parts of the sacrificial layers remain, and after the source/drain contact is formed, the remaining parts of the sacrificial layers are disposed between the source/drain contact and the gate structure.

In accordance with another aspect of the present disclosure, in a method of manufacturing a semiconductor device, a fin structure including semiconductor layers and sacrificial layers are alternately stacked is formed over a first dielectric layer, a sacrificial gate structure is formed over the fin structure, gate sidewall spacers are formed on opposing side faces of the sacrificial gate structure, a second dielectric layer is formed over the sacrificial gate structure and the fin structure, the sacrificial gate structure is removed, thereby forming a gate space, the sacrificial layers are removed in the gate space, thereby releasing channel regions of the semiconductor layers, a gate structure wrapping around the channel regions of the semiconductor layers is formed, a third dielectric layer is formed, a contact opening is formed in the third dielectric layer and the second dielectric layer, the sacrificial layers and the semiconductor layer are removed in the contact opening, and a source/drain contact is formed in the contact opening. The semiconductor layers are made of an oxide semiconductor material. In one or more of the foregoing and/or following embodiments, the oxide semiconductor material includes one selected from the group consisting of indium gallium zinc oxide (IGZO), c-axis aligned crystal (CAAC)-IGZO, ZnO, $In_2O_3$, $Ga_2O_3$, and ZnON. In one or more of the foregoing and/or following embodiments, the oxide semiconductor material includes amorphous indium gallium zinc oxide (IGZO). In one or more of the foregoing and/or following embodiments, the sacrificial layer includes one selected from the group consisting of as silicon oxide, silicon nitride, silicon oxynitride, SiOC, aluminum oxide, hafnium oxide. In one or more of the foregoing and/or following embodiments, in the removing the sacrificial layers in the contact opening, parts of the sacrificial layers remain, and after the source/drain contact is formed, the remaining parts of the sacrificial layers are disposed between the source/drain contact and the gate structure.

In accordance with one aspect of the present disclosure, a semiconductor device includes a power switch circuit and a logic circuit. The semiconductor device includes a first dielectric layer and a thin film transistor (TFT) formed on the first dielectric layer. The TFT includes a semiconductor nano-sheet, a gate dielectric layer wrapping around a channel region of the semiconductor nano-sheet, and a gate electrode layer formed on the gate dielectric layer. The semiconductor nano-sheet is made of an oxide semiconductor material. In one or more of the foregoing and/or following embodiments, the oxide semiconductor material includes one selected from the group consisting of indium gallium zinc oxide (IGZO), c-axis aligned crystal (CAAC)-IGZO, ZnO, $In_2O_3$, $Ga_2O_3$, and ZnON. In one or more of the foregoing and/or following embodiments, the oxide semiconductor material includes amorphous indium gallium zinc oxide (IGZO). In one or more of the foregoing and/or following embodiments, a thickness Ti of the semiconductor nano-sheet is in a range from 5 nm to 30 nm, and a width $W1$ of each of the semiconductor nano-sheets along a gate extending direction is in a range from 10 nm to 50 nm. In one or more of the foregoing and/or following embodiments, a ratio $W1/T1$ is in a range from 1.2 to 10.

In accordance with another aspect of the present disclosure, a semiconductor device includes a power switch circuit and a logic circuit. The power switch circuit includes a first dielectric layer and a thin film transistor (TFT) formed on the first dielectric layer. The TFT includes semiconductor nano-sheets vertically arranged, a gate dielectric layer wrapping around a channel region of each of the semiconductor nano-sheets, and a gate electrode layer formed on the gate dielectric layer. The semiconductor nano-sheets are made of an oxide semiconductor material. In one or more of the foregoing and/or following embodiments, the oxide semiconductor material includes one selected from the group consisting of indium gallium zinc oxide (IGZO), c-axis aligned crystal (CAAC)-IGZO, ZnO, $In_2O_3$, $Ga_2O_3$, and ZnON. In one or more of the foregoing and/or following embodiments, the oxide semiconductor material includes amorphous indium gallium zinc oxide (IGZO). In one or more of the foregoing and/or following embodiments, a thickness $T1$ of each of the semiconductor nano-sheets is in a range from 5 nm to 30 nm, and a width $W1$ of each of the semiconductor nano-sheets along a gate extending direction is in a range from 10 nm to 50 nm. In one or more of the foregoing and/or following embodiments, a ratio $W1/T1$ is in a range from 2 to 5. In one or more of the foregoing and/or following embodiments, a number of the semiconductor nano-sheets is in a range from 2 to 10. In one or more of the foregoing and/or following embodiments, the TFT further includes a source/drain contact wrapping around a source/drain region of each of the semiconductor nano-sheets. In one or more of the foregoing and/or following embodiments, the TFT further includes inner spacers disposed between the source/drain contact and the gate electrode layer. In one or more of the foregoing and/or following embodiments, the TFT further includes a source/drain contact in contact with end faces of the semiconductor nano-sheets. In one or more of the foregoing and/or following embodiments, the TFT further includes inner spacers disposed between the source/drain contact and the gate electrode layer.

In accordance with another aspect of the present disclosure, a semiconductor device including a power switch circuit and a logic circuit, and the semiconductor device includes a first dielectric layer, and a thin film transistor (TFT) formed on the first dielectric layer. The TFT includes a plurality of groups of semiconductor nano-sheets, wherein the semiconductor nano-sheets are vertically arranged in each of the plurality of groups, a gate dielectric layer wrapping around a channel region of each of the semiconductor nano-sheets of the plurality of groups of semiconductor nano-sheets, and a gate electrode layer formed on the gate dielectric layer over the plurality of groups of semiconductor nano-sheets. The semiconductor nano-sheets are made of an oxide semiconductor material. In one or more of the foregoing and/or following embodiments, the oxide semiconductor material includes amorphous indium gallium zinc oxide (IGZO). In one or more of the foregoing and/or following embodiments, a thickness T1 of each of the semiconductor nano-sheets is in a range from 5 nm to 30 nm, and a width W1 of each of the semiconductor nano-sheets along a gate extending direction is in a range from 10 nm to 50 nm. In one or more of the foregoing and/or following embodiments, a number of the semiconductor nano-sheets is in a range from 2 to 10. In one or more of the foregoing and/or following embodiments, a number of the plurality of groups is in a range from 2 to 5.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a power switch circuit and a logic circuit, the power switch circuit comprising:
   a first dielectric layer;
   a thin film transistor (TFT) formed on the first dielectric layer in a back end of the line (BEOL) circuit level of the semiconductor device, wherein:
   the TFT includes:
      semiconductor nano-sheets;
      a gate dielectric layer wrapping around a channel region of the semiconductor nano-sheets, wherein for each semiconductor nano-sheet, the gate dielectric layer covers all sides of the nano-sheet when viewed in cross-section across the semiconductor nano-sheets;
      a gate electrode layer formed on the gate dielectric layer; and
      a source/drain contact in contact with and wrapping around a source/drain region of each of the semiconductor nano-sheets, the source/drain contact having a multilayer structure including a liner layer and a body contact layer,
   a field effect transistor (FET) formed in a front end of the line (FEOL) circuit level of the semiconductor device below the BEOL circuit level and electrically connected to the TFT,
   wherein a plurality of intervening metallization layers are disposed between the TFT and the FET,
   wherein the TFT is configured as a header switch or a footer switch between a main power supply line and a virtual power supply line, and
   wherein each of the semiconductor nano-sheets further includes an end region, wherein for each of the semiconductor nano-sheets, the source/drain region is interposed between the end region and the channel region, and the source/drain contact does not wrap around the end region.

2. The semiconductor device of claim 1, wherein each nano-sheet has a thickness T1, and a space S1 is provided between adjacent semiconductor nano-sheets, wherein S1 is measured from a lower surface of a first semiconductor nano-sheet to an upper surface of a semiconductor nano-sheet immediately adjacent to the first semiconductor nano-sheet when viewed in the cross-section across the semiconductor nano-sheets, and the space S1 is greater than the thickness T1.

3. The semiconductor device of claim 1, wherein each nano-sheet has a thickness T1, and a space S1 is provided between adjacent semiconductor nano-sheets, wherein S1 is measured from a lower surface of a first semiconductor nano-sheet to an upper surface of a semiconductor nano-sheet immediately adjacent to the first semiconductor nano-sheet when viewed in the cross-section across the semiconductor nano-sheets, and the space S1 is equal to the thickness T1.

4. A semiconductor device including a power switch circuit and a logic circuit, the power switch circuit comprising:
   a first dielectric layer;
   a first thin film transistor (TFT) formed on the first dielectric layer in a back end of the line (BEOL) circuit level of the semiconductor device, wherein:
   the first TFT includes:
      semiconductor nano-sheets vertically arranged;
      a gate dielectric layer wrapping around a channel region of each of the semiconductor nano-sheets, wherein for each semiconductor nano-sheet, the gate dielectric layer covers all sides of the nano-sheet when viewed in cross-section across the semiconductor nano-sheets;
      a gate electrode layer formed on the gate dielectric layer; and
      a source/drain contact in contact with and wrapping around a source/drain region of each of the semiconductor nano-sheets, the source/drain contact having a multilayer structure including a liner layer and a body contact layer,
   wherein the semiconductor nano-sheets are made of an oxide semiconductor material, the source/drain contact includes a first layer made of one or more of Ti, TiN, Ta or TaN, and a second layer having a greater thickness than the first layer and made of one or more of W, Cu, Ti, Ag, Al, Mn, Co, Pd, Ni, Re, Ir, Ru, Pt, or Zr, a second TFT formed over a second dielectric layer in the BEOL circuit level of the semiconductor device and electrically connected to the first TFT; and a field effect transistor (FET) formed in a front end of the line (FEOL) circuit level of the semiconductor device below the BEOL circuit level and electrically connected to the first TFT, wherein at least one of the first TFT and the second TFT is configured as a header switch or a footer switch between a main power supply line and a virtual power supply line, and wherein each of the semiconductor nano-sheets further includes an end region, wherein for each of the semiconductor nano-sheets, the source/drain region is interposed between the end region and the channel region, and the source/drain contact does not wrap around the end region.

5. The semiconductor device of claim 4, wherein the oxide semiconductor material includes one selected from the group consisting of c-axis aligned crystal (CAAC)-IGZO, amorphous IGZO, ZnO, $In_2O_3$, $Ga_2O_3$, and ZnON.

6. The semiconductor device of claim 4, wherein the oxide semiconductor material includes c-axis aligned crystal indium gallium zinc oxide (IGZO).

7. The semiconductor device of claim 4, wherein each nano-sheet has a thickness T1, and a space S1 is provided between adjacent semiconductor nano-sheets, wherein S1 is measured from a lower surface of a first semiconductor nano-sheet to an upper surface of a semiconductor nano-sheet immediately adjacent to the first semiconductor nano-sheet when viewed in the cross-section across the semiconductor nano-sheets, and the space S1 is greater than the thickness T1.

8. The semiconductor device of claim 4, wherein each nano-sheet has a thickness T1, and a space S1 is provided between adjacent semiconductor nano-sheets, wherein S1 is measured from a lower surface of a first semiconductor nano-sheet to an upper surface of a semiconductor nano-sheet immediately adjacent to the first semiconductor nano-sheet when viewed in the cross-section across the semiconductor nano-sheets, and the space S1 is equal to the thickness T1.

9. The semiconductor device of claim 4, wherein a number of the semiconductor nano-sheets is in a range from 2 to 10.

10. The semiconductor device of claim 4, wherein the first TFT further includes inner spacers disposed between the source/drain contact and the gate electrode layer.

11. A semiconductor device including a power switch circuit and a logic circuit, the power switch circuit comprising:

a first dielectric layer;

a first thin film transistor (TFT) formed on the first dielectric layer in a back end of the line (BEOL) circuit level of the semiconductor device, wherein:

the first TFT includes:

a plurality of groups of semiconductor nano-sheets, wherein the semiconductor nano-sheets are vertically arranged in each of the plurality of groups;

a gate dielectric layer wrapping around a channel region of each of the semiconductor nano-sheets of the plurality of groups of semiconductor nano-sheets;

a gate electrode layer formed on the gate dielectric layer over the plurality of groups of semiconductor nano-sheets; and a source/drain contact contacting and wrapping around a source/drain region of each of the semiconductor nano-sheets of the plurality of groups of semiconductor nano-sheets, the source/drain contact having a multilayer structure including a liner layer and a body contact layer, wherein the semiconductor nano-sheets are made of an oxide semiconductor material, each nano-sheet has a thickness T1, wherein for each semiconductor nano-sheet, the gate dielectric layer covers all sides of the nano-sheet when viewed in cross-section across the semiconductor nano-sheets, and a space S1 is provided between adjacent semiconductor nano-sheets;

a second TFT formed over a second dielectric layer in the BEOL circuit level of the semiconductor device and electrically connected to the first TFT, wherein a thickness of the second dielectric layer is thinner than the first dielectric layer, wherein at least one of the first TFT and the second TFT is configured as a header switch or a footer switch between a main power supply line and a virtual power supply line, and wherein each of the semiconductor nano-sheets further includes an end region, wherein for each of the semiconductor nano-sheets, the source/drain region is interposed between the end region and the channel region, and the source/drain contact does not wrap around the end region.

12. The semiconductor device of claim 11, wherein the space S1 is less than the thickness T1.

13. The semiconductor device of claim 11, wherein a number of the semiconductor nano-sheets is in a range from 2 to 10.

14. The semiconductor device of claim 11, wherein a number of the plurality of groups is in a range from 2 to 5.

15. The semiconductor device of claim 11, wherein in plan view, the gate electrode layer and the source/drain contact extend in a same direction and have a same length.

16. The semiconductor device of claim 11, wherein the oxide semiconductor material includes c-axis aligned crystal indium gallium zinc oxide.

17. The semiconductor device of claim 4, wherein the oxide semiconductor material includes ZnON.

18. The semiconductor device of claim 1, wherein the semiconductor nano-sheets are made of an oxide semiconductor material c-axis aligned crystal (CAAC)-indium gallium zinc oxide (IGZO), each nano-sheet has a thickness T1, a space S1 is provided between adjacent semiconductor nano-sheets, wherein S1 is measured from a lower surface of a first semiconductor nano-sheet to an upper surface of a semiconductor nano-sheet immediately adjacent to the first semiconductor nano-sheet when viewed in the cross-section across the semiconductor nano-sheets, the thickness T1 of each semiconductor nano-sheet is in a range from 5 nm to 30 nm when viewed in the cross-section across the semiconductor nano-sheets, a width W1 of each semiconductor nano-sheet is in a range from 10 nm to 50 nm when viewed in the cross-section across the semiconductor nano-sheets, and a ratio W1/T1 is in a range from 2 to 5 when viewed in the cross-section across the semiconductor nano-sheets.

19. The semiconductor device of claim 11, wherein the thickness T1 of each semiconductor nano-sheet is in a range from 5 nm to 30 nm when viewed in the cross-section across the semiconductor nano-sheets, and a width W1 of each semiconductor nano-sheet is in a range from 10 nm to 50 nm when viewed in the cross-section across the semiconductor nano-sheets.

20. The semiconductor device of claim 19, wherein a ratio W1/T1 is in a range from 2 to 5 when viewed in the cross-section across the semiconductor nano-sheets.

* * * * *